United States Patent
Naono

(10) Patent No.: US 10,281,716 B2
(45) Date of Patent: May 7, 2019

(54) MIRROR DRIVING DEVICE AND DRIVING METHOD THEREOF

(71) Applicant: FUJIFILM Corporation, Tokyo (JP)

(72) Inventor: Takayuki Naono, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 72 days.

(21) Appl. No.: 15/473,221

(22) Filed: Mar. 29, 2017

(65) Prior Publication Data
US 2017/0205624 A1    Jul. 20, 2017

Related U.S. Application Data

(63) Continuation of application No. PCT/JP2015/077589, filed on Sep. 29, 2015.

(30) Foreign Application Priority Data

Sep. 30, 2014   (JP) .................... 2014-201651

(51) Int. Cl.
G02B 26/10    (2006.01)
G02B 26/08    (2006.01)
(Continued)

(52) U.S. Cl.
CPC .......... *G02B 26/105* (2013.01); *B81B 3/0043* (2013.01); *G02B 26/08* (2013.01);
(Continued)

(58) Field of Classification Search
CPC .. G02B 26/105; G02B 26/08; G02B 26/0858; G02B 26/10; H01L 41/0933; H01L 41/094; H01L 41/0946; H01L 41/096
(Continued)

(56) References Cited

U.S. PATENT DOCUMENTS

2007/0269199 A1*  11/2007  Mori ............... G02B 26/0858
                                                    396/322
2010/0195180 A1    8/2010  Akanuma et al.
(Continued)

FOREIGN PATENT DOCUMENTS

EP       1857855 A2    11/2007
JP     H11-112048 A     4/1999
(Continued)

OTHER PUBLICATIONS

The extended European search report issued by the European Patent Office dated Aug. 17, 2017, which corresponds to European Patent Application No. 15846689.6-1556 and is related to U.S. Appl. No. 15/473,221.
(Continued)

*Primary Examiner* — Kristina M Deherrera
(74) *Attorney, Agent, or Firm* — Studebaker & Brackett PC

(57) ABSTRACT

A piezoelectric actuator part which generates a driving force to rotate a mirror part about a rotation axis includes a first actuator part and a second actuator part having a both-end supported beam structure in which base end parts on both sides in an axial direction of the rotation axis are fixed. The first actuator part has a first electrode part and second electrode parts. The second actuator part has third electrode parts and a fourth electrode part. The arrangement of the each electrode part constituting an upper electrode corresponds to a stress distribution of principal stresses in a piezoelectric body during resonance mode vibration, and a piezoelectric portion corresponding to positions of the first electrode part and the third electrode parts and a piezoelectric portion corresponding to positions of the second electrode parts and the fourth electrode part generate stresses in opposite directions.

14 Claims, 15 Drawing Sheets

(51) Int. Cl.
*H01L 41/09* (2006.01)
*H01L 41/18* (2006.01)
*B81B 3/00* (2006.01)

(52) U.S. Cl.
CPC ......... *G02B 26/0858* (2013.01); *G02B 26/10* (2013.01); *H01L 41/0933* (2013.01); *H01L 41/0993* (2013.01); *H01L 41/18* (2013.01); *B81B 2201/042* (2013.01)

(58) Field of Classification Search
USPC .................. 359/198.1–199.4, 213.1–214.1
See application file for complete search history.

(56) References Cited

U.S. PATENT DOCUMENTS

| 2012/0250127 | A1 | 10/2012 | Naono | |
| 2014/0355088 | A1* | 12/2014 | Yasuda | G02B 26/105 |
| | | | | 359/199.4 |
| 2016/0020381 | A1* | 1/2016 | Arakawa | C04B 35/499 |
| | | | | 428/220 |

FOREIGN PATENT DOCUMENTS

| JP | 2005-128147 A | 5/2005 |
| JP | 2009-002978 A | 1/2009 |
| JP | 2010-085506 A | 4/2010 |
| JP | 2010-197994 A | 9/2010 |
| JP | 2012-208352 A | 10/2012 |
| WO | 2010/035469 A1 | 4/2010 |
| WO | 2012/014666 A1 | 2/2012 |

OTHER PUBLICATIONS

An Office Action; "Notice of Reasons for Rejection," mailed by the Japanese Patent Office dated Nov. 6, 2017, which corresponds to Japanese Patent Application No. 2016-552089 and is related to U.S. Appl. No. 15/473,221.
International Search Report issued in PCT/JP2015/077589; dated Dec. 15, 2015.
Written Opinion issued in PCT/JP2015/077589; dated Dec. 15, 2015.
Masanao Tani et al.; "A Combination of Fast Resonant Mode and Slow Static Deflection of SOI-PZT Actuators for MEMS Image Projection Display"; Optical MEMS and Their Applications Conference; 2006; pp. 25-26; IEEE/LEOS International Conference; Japan.
Hirokazu Matsuo et al.; "Novel Design for Optical Scanner with Piezoelectric Film Deposited by Metal Organic Chemical Vapor Deposition"; Japanese Journal of Applied Physics; 2010; pp. 1-4; 49, 04DL19; The Japan Society of Applied Physics; Japan.
Utku Baran et al.; "Resonant PZT MEMS Scanner for High-Resolution Displays"; Journal of Microelectromechanical Systems; Dec. 2012; pp. 1303-1310; vol. 21, No. 6; IEEE.

* cited by examiner

MIRROR DRIVING DEVICE AND DRIVING METHOD THEREOF

CROSS-REFERENCE TO RELATED APPLICATIONS

The present application is a Continuation of PCT International Application No. PCT/JP2015/077589 filed on Sep. 29, 2015 claiming priority under 35 U.S.C § 119(a) to Japanese Patent Application No. 2014-201651 filed on Sep. 30, 2014. Each of the above applications is hereby expressly incorporated by reference, in their entirety, into the present application.

BACKGROUND OF THE INVENTION

1. Field of the Invention

The present invention relates to a mirror driving device and a driving method thereof, and more particularly to a structure of a micromirror device suitable for an optical deflector used for optical scanning and a driving method thereof.

2. Description of the Related Art

A microscanner fabricated using a silicon (Si) microfabrication technology (hereinafter referred to as "microelectromechanical system (MEMS) scanner") is characterized by its small size and low power consumption, and is thus expected to be widely used in applications ranging from a laser projector to an optical diagnostic scanner such as an optical coherence tomograph.

There are various driving systems for MEMS scanners. Among these, a piezoelectric driving system which uses the deformation of a piezoelectric body is regarded as having a higher torque density and a smaller size and obtaining a higher scan angle compared to other methods, and is thus considered to be promising. Particularly, in applications requiring a high displacement angle such as in a laser display, resonance driving is mainly used, and at this time, the height of a torque of the piezoelectric driving system is a great advantage.

As a piezoelectric MEMS scanner in the related art, for example, as described in JP2009-2978A, there is a system in which a torsion bar is connected to a connection part (joining part) in an actuator having a structure in which two cantilevers are connected, and the torsion bar is caused to undergo tilt displacement by driving the cantilever in antiphase (JP2009-2978A).

In addition, as in Optical MEMS and Their Applications Conference, 2006, IEEE/LEOS International Conference on, 2006, 25-26, and Japanese Journal of Applied Physics, The Japan Society of Applied Physics, 2010, 49, 04DL19, there may be cases where an actuator has a circular or elliptical shape. By causing the actuator to have such a shape, the length of the actuator can be increased compared to a linear cantilever, so that the displacement amount can be increased. In the structures of JP2009-2978A, Optical MEMS and Their Applications Conference, 2006. IEEE/LEOS International Conference on, 2006, 25-26, and Japanese Journal of Applied Physics, The Japan Society of Applied Physics, 2010, 49, 04DL19, two plate-like actuators disposed on both sides of the rotation axis of a mirror are provided, and the actuators are common in that base end parts which are separated from each other in a direction perpendicular to the rotation axis are fixed.

Contrary to this, JOURNAL OF MICROELECTROMECHANICAL SYSTEMS, Vol. 21, 6 (2012), 1303-1310 proposes a structure in which two plate-like actuators disposed on both sides of the rotation axis of a mirror are provided and the actuators are fixed on the rotation axis of the mirror. This structure has an advantage that a mirror tilt angle that is obtained during resonance driving is large because the amount of the actuator displaced during static driving is larger than that of the structure of JP2009-2978A.

However, in the piezoelectric MEMS scanner having such a structure, the piezoelectric torque cannot be efficiently converted into tilt displacement, and a high voltage of about 25 V is necessary to obtain a sufficient displacement angle. In consideration of the durability of a lead zirconate titanate (PZT) thin film, driving at about 15 V is preferable.

In addition, in a case of an operation using the resonance driving, in order to maintain vibration in a resonance mode, a sensor (stress detection part) which monitors the drive displacement is necessary. For this, one of the actuators needs to be used as a sensor part, which causes a problem that the driving force significantly decreases to about half.

The present invention has been made taking the foregoing circumstances into consideration, and an object thereof is to provide a mirror driving device and a driving method thereof capable of improving a displacement efficiency compared to a structure in the related art and obtaining a sufficiently large displacement angle even in a case where a sensor part is provided.

SUMMARY OF THE INVENTION

In order to achieve the above object, the following invention aspects are provided.

A mirror driving device according to a first aspect comprises: a mirror part having a reflecting surface; a mirror support part which is connected to the mirror part and supports the mirror part so as to be rotatable about a rotation axis; a piezoelectric actuator part which is connected to the mirror support part and generates a driving force to rotate the mirror part about the rotation axis; and a fixing part which supports the piezoelectric actuator part, in which the piezoelectric actuator part includes a first actuator part and a second actuator part that are deformed by an inverse piezoelectric effect of a piezoelectric body caused by application of a drive voltage, the first actuator part is disposed on one side of both sides of a direction which is orthogonal to a film thickness direction of the piezoelectric body and is an orthogonal direction of the rotation axis in the orthogonal direction which is orthogonal to an axial direction of the rotation axis, with the rotation axis interposed between the both sides in the orthogonal direction of the rotation axis, and the second actuator part is disposed on the other side of the both sides, each of the first actuator part and the second actuator part is connected to the mirror support part, with a configuration in which a first base end part, which is positioned on a side in the axial direction in the first actuator part opposite to a first connection point that is a connection portion between the first actuator part and the mirror support part, and a second base end part, which is positioned on a side in the axial direction in the second actuator part opposite to a second connection point that is a connection portion between the second actuator part and the mirror support part, are fixed to the fixing part, each of the first actuator part and the second actuator part is supported by the fixing part in a both-end supported beam structure, the mirror support part is driven to be tilted by causing the first actuator part and the second actuator part to bend in opposite directions, the upper electrodes of the first actuator part respectively include a first electrode part and a second electrode part constituted by a single or a plurality of electrodes, the upper electrodes of the second actuator part respectively include a third electrode part and a fourth electrode part constituted by a single or a plurality of electrodes, an arrangement of the first electrode part, the second electrode part, the third electrode part, and the fourth electrode part corresponds to a stress distribution of principal stresses in an in-plane direction orthogonal to the film thickness direction of the piezoelectric body during resonance mode vibration accompanied with tilt displacement of the mirror part due to rotation about the rotation axis, and a piezoelectric portion corresponding to positions of the first electrode part and the third electrode part and a piezoelectric portion corresponding to positions of the second electrode part and the fourth electrode part are configured to generate stresses in opposite directions during the resonance mode vibration.

In the mirror driving device of the first aspect, since the electrode parts are disposed in a divided form to correspond to a direction of stress in the piezoelectric body during driving the piezoelectric actuator part (that is, during displacement), driving can be more efficiently performed than in a configuration in the related art.

As a second aspect, in the mirror driving device of the first aspect, the first connection point and the first base end part may be in a positional relationship so as to be distant from the center of the mirror part in this order in the axial direction of the rotation axis, and the second connection point and the second base end part may be in a positional relationship so as to be distant from the center of the mirror part in this order in the axial direction of the rotation axis.

As a third aspect, the mirror driving device of the first aspect or the second aspect may further comprise: a first connection part which is a member that connects the first actuator part to the mirror support part; and a second connection part which is a member that connects the second actuator part to the mirror support part.

As a fourth aspect, in the mirror driving device of any one of the first to third aspects, the first actuator part and the second actuator part may be connected to each other, and the mirror support part may be connected to a connection portion between the first actuator part and the second actuator part.

In a case of the fourth aspect, a form in which member elements of the first connection part and the second connection part described in the third aspect are omitted is possible.

As a fifth aspect, in the mirror driving device of any one of the first to fourth aspects, the first base end part and the second base end part may be connected to each other.

An integral base end part shape in which the first base end part and the second base end part are integrated with each other can be achieved.

As a sixth aspect, in the mirror driving device of any one of the first to fifth aspects, each of the first actuator part and the second actuator part may be a piezoelectric unimorph actuator having a laminated structure in which a vibration plate, a lower electrode, a piezoelectric body, and an upper electrode are laminated in this order.

The structure of the piezoelectric actuator part is not limited to a unimorph structure and a bimorph structure is also possible, but a unimorph structure is the simplest configuration. Since a piezoelectric driving system can be driven only by applying a voltage between electrodes, the configuration is simple and is useful for miniaturization.

As a seventh aspect, in the mirror driving device of any one of the first to sixth aspects, a first mirror support part and a second mirror support part, which support the mirror part from both sides in the axial direction of the rotation axis, may be provided as the mirror support part.

As an eighth aspect, in the mirror driving device of any one of the first to seventh aspects, the first actuator part may have the first base end part at each of end parts on both sides in the axial direction, a movable part that extends from the first base end part at one of the end parts on both sides of the first actuator part to the first base end part at the other thereof may have a shape bypassing the mirror part, the second actuator part may have the second base end part at each of the end parts on both sides in the axial direction, and a movable part that extends from the second base end part at one of the end parts on both sides of the second actuator part to the second base end part at the other thereof may have a shape bypassing the mirror part.

As a ninth aspect, in the mirror driving device of any one of the first to eighth aspects, the mirror part, the mirror support part, the first actuator part, and the second actuator part may have a line symmetrical form with respect to the rotation axis as an axis of symmetry, in a plan view in a non-driven state.

As a tenth aspect, in the mirror driving device of any one of the first to ninth aspects, the mirror part, the mirror support part, the first actuator part, and the second actuator part may have a line symmetrical form with respect to a center line which passes through the center of the mirror part and is orthogonal to the rotation axis as an axis of symmetry, in the plan view in the non-driven state.

As an eleventh aspect, the mirror driving device of any one of the first to tenth aspects may further comprise: a driving circuit which applies a voltage for driving to electrodes constituting at least one electrode part of the first electrode part or the third electrode part, and applies a voltage for driving to electrodes constituting at least one electrode part of the second electrode part or the fourth electrode part, in which a phase difference ϕ between a voltage waveform of the drive voltage applied to at least one electrode part of the first electrode part or the third electrode part and a voltage waveform of the drive voltage applied to at least one electrode part of the second electrode part or the fourth electrode part may be within the range of $130° \leq \phi \leq 230°$.

As a twelfth aspect, in the mirror driving device of any one of the first to eleventh aspects, some of the electrodes among a plurality of electrodes constituting the first electrode part, the second electrode part, the third electrode part, and the fourth electrode part may be set to be at a floating potential, and a detection circuit which detects a voltage generated by a piezoelectric effect accompanied with deformation of the piezoelectric body from the electrode at the floating potential may be provided.

As a thirteenth aspect, the mirror driving device of any one of the first to twelfth aspects may further comprise: a driving circuit which supplies a drive voltage to the piezoelectric actuator part, in which the driving circuit may supply a voltage waveform of the drive voltage for causing the mirror part to undergo resonance driving.

As a fourteenth aspect, in the mirror driving device of any one of the first to thirteenth aspects, the piezoelectric body used in the piezoelectric actuator part may be a thin film having a thickness of 1 to 10 μm and may be a thin film directly formed on a substrate which serves as a vibration plate.

According to this aspect, by using a direct film formation method such as a vapor deposition method represented by a sputtering method or a sol-gel method, a piezoelectric thin film having required piezoelectric performance can be obtained. By directly forming the piezoelectric thin film on a substrate and processing the resultant in a semiconductor process such as dry etching or wet etching, the fabrication process of the device can be simplified.

In a fifteenth aspect, in the mirror driving device of any one of the first to fourteenth aspects, the piezoelectric body used in the piezoelectric actuator part may be one or two or more perovskite type oxides represented by the following general formula (P-1).

General formula ABO$_3$ (P-1)

in the formula, A is an element in A-site and is at least one element including Pb.

B is an element in B-site and is at least one element selected from the group consisting of Ti, Zr, V, Nb, Ta, Sb, Cr, Mo, W, Mn, Sc, Co, Cu, In, Sn, Ga, Zn, Cd, Fe, Mg, Si, and Ni.

O is an oxygen element.

The molar ratio among the A-site element, the B-site element, and the oxygen element is 1:1:3 as a standard, and the molar ratio may be deviated from the reference molar ratio within a range in which a perovskite structure is able to be achieved.

As a sixteenth aspect, in the mirror driving device of any one of the first to fourteenth aspects, the piezoelectric body used in the piezoelectric actuator part may be one or two or more perovskite type oxides represented by the following general formula (P-2).

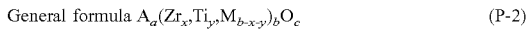

General formula $A_a(Zr_x,Ti_y,M_{b-x-y})_bO_c$ (P-2)

in the formula, A is an element in A-site and is at least one element including Pb.

M is at least one element selected from the group consisting of V, Nb, Ta, and Sb. $0<x<b$, $0<y<b$, and $0 \le b-x-y$ are satisfied.

a:b:c=1:1:3 is standard, and the molar ratio may be deviated from the reference molar ratio within a range in which the perovskite structure is able to be achieved.

PZT doped with an element such as Nb has a high piezoelectric constant and is thus suitable for fabrication of a device which has a small size and can achieve large displacement. In addition, for a piezoelectric body used in a stress detection part, the same piezoelectric material as that of the piezoelectric actuator part may be used.

As a seventeenth aspect, in the mirror driving device of the sixteenth aspect, the perovskite type oxide (P-2) may include Nb, and the molar ratio Nb/(Zr+Ti+Nb) may be 0.06 or more and 0.20 or less.

Such a material exhibits good piezoelectric characteristics even when a polarization treatment is not performed thereon. Therefore, the polarization treatment is unnecessary, simplification and a reduction in costs of the production process can be realized.

A mirror driving method according to an eighteenth aspect is a mirror driving method in the mirror driving device of any one of the first to seventeenth aspects, in which a drive voltage is applied to an electrode constituting at least one electrode part of the first electrode part or the third electrode part, a drive voltage is applied to an electrode constituting at least one electrode part of the second electrode part or the fourth electrode part, and a phase difference ϕ between the drive voltage applied to at least one electrode part of the first electrode part or the third electrode part and the drive voltage applied to at least one electrode part of the second electrode part or the fourth electrode part is within the range of 130°≤ϕ≤230°.

In the mirror driving method according to a nineteenth aspect, some of the electrodes among a plurality of electrodes constituting the first electrode part, the second electrode part, the third electrode part, and the fourth electrode part may be used as a detection electrode which detects a voltage generated by a piezoelectric effect accompanied with deformation of the piezoelectric body, and a detection signal may be obtained from the detection electrodes during driving of the mirror part, in the mirror driving method of the eighteenth aspect.

For example, at least one of the frequency (driving frequency) or the amplitude of the drive voltage supplied to the piezoelectric actuator part can be controlled on the basis of the detection signal obtained from the detection electrode. Stable resonance driving can be realized by feeding back the detection signal to drive the piezoelectric actuator part.

According to the present invention, since the electrode parts are disposed according to the distribution of the stresses generated in the piezoelectric body during the deformation of the actuator parts, driving can be efficiently performed, and a larger mirror tilt angle can be obtained compared to the configuration in the related art. Furthermore, since the displacement efficiency is improved, even in a case where some of the electrodes are used for detection, a sufficient displacement angle can be obtained.

DESCRIPTION OF THE PREFERRED EMBODIMENTS

Hereinafter, embodiments for embodying the present invention will be described in detail with reference to the accompanying drawings.

<First Embodiment>

Figure 1:
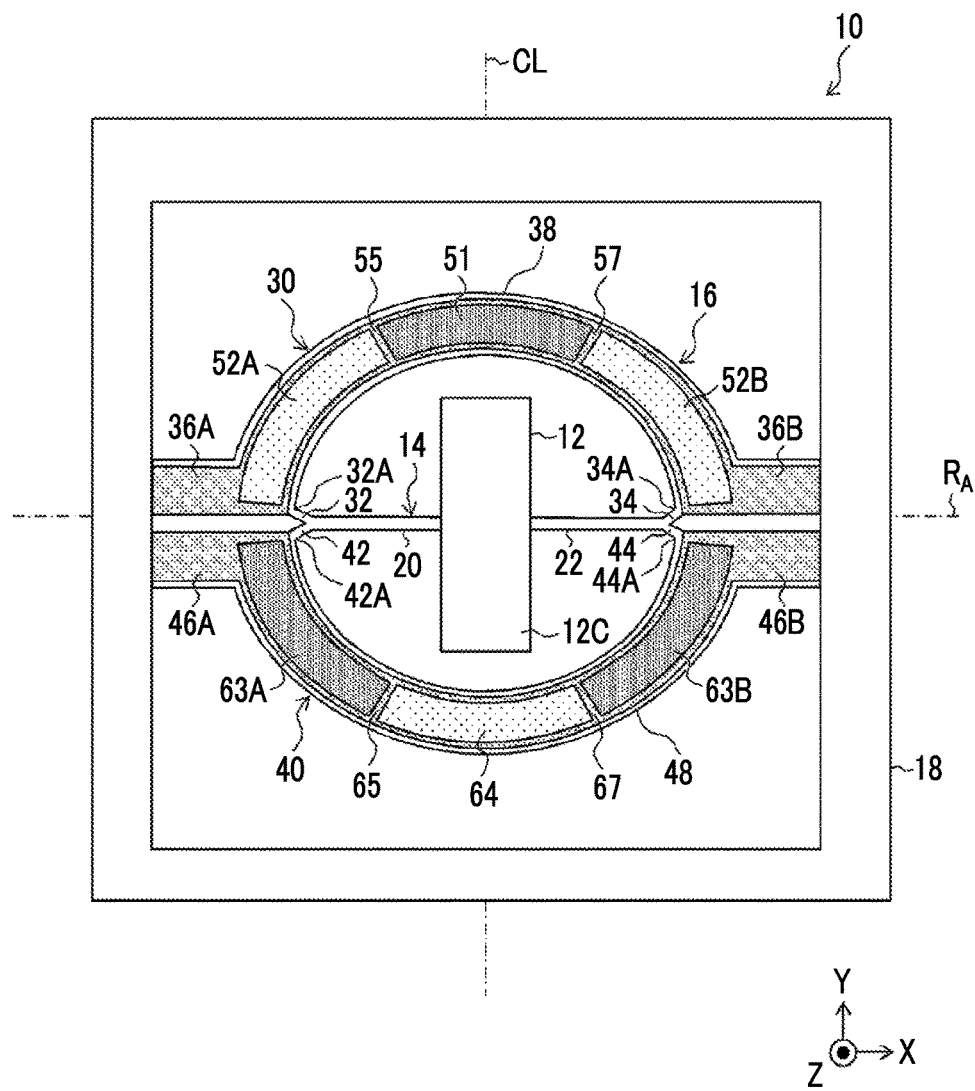
FIG. 1 is a plan view illustrating the configuration of a micromirror device according to a first embodiment.

FIG. 1 is a plan view illustrating a configuration of a micromirror device according to a first embodiment. The micromirror device 10 comprises a mirror part 12, a mirror support part 14, a piezoelectric actuator part 16, and a fixing frame 18. The micromirror device 10 corresponds to a form of "mirror driving device".

The upper surface of the mirror part 12 is a reflecting surface 12C that reflects light. A metal thin film such as Au (gold) or Al (aluminum) is formed on the reflecting surface 12C in order to increase the reflectance of incident rays. Materials and film thicknesses used for mirror coating are not particularly limited, and various designs are possible using well-known mirror materials (high reflectance materials).

The shape in the plan view of the mirror part 12 that functions as the reflecting part and the shape of the reflecting surface 12C which is a mirror coated region may be coincident with each other or may be different from each other. The reflecting surface 12C can be formed within the area range of the upper surface of the mirror part 12. Although the mirror part 12 having the reflecting surface 12C that reflects light is described in this example, a form in which a reflecting surface 12C that reflects sound waves, electromagnetic waves, or the like is implemented is also possible.

The mirror support part 14 is connected to the mirror part 12, and supports the mirror part 12 so as to be rotatable about a rotation axis $R_A$. The mirror support part 14 is constituted by a first torsion bar part 20 and a second torsion bar part 22. The first torsion bar part 20 and the second torsion bar part 22 support the mirror part 12 from both sides in the axial direction of the rotation axis $R_A$ with respect to the mirror part 12. The first torsion bar part 20 corresponds to a form of "first mirror support part", and the second torsion bar part 22 corresponds to a form of "second mirror support part".

The piezoelectric actuator part 16 is connected to the mirror support part 14, and generates a driving force to rotate the mirror part 12 about the rotation axis $R_A$.

The fixing frame 18 is a member that supports the piezoelectric actuator part 16. Since the mirror part 12 is supported by the piezoelectric actuator part 16 via the mirror support part 14, the fixing frame 18 functions as a member that indirectly supports the mirror part 12 via the piezoelectric actuator part 16. In addition, in the fixing frame 18, wiring and electronic circuits (not illustrated) are provided.

Hereinafter, for convenience of description, orthogonal xyz axes are introduced into FIG. 1 and explained. A direction normal to the reflecting surface 12C (a direction perpendicular to FIG. 1) in a case where the piezoelectric actuator part 16 is in a non-driven state is defined as a z-axis direction. The z-axis direction is the film thickness direction of a piezoelectric body in the piezoelectric actuator part 16. A direction parallel to a principal axis which is the rotation axis $R_A$ of the mirror part 12 rotated by the first torsion bar part 20 and the second torsion bar part 22 (horizontal direction parallel to FIG. 1) is defined as an x-axis direction. A direction orthogonal to both the x-axis and the z-axis (vertical direction parallel to FIG. 1) is defined as a y-axis direction. The x-axis direction is the axial direction of the rotation axis $R_A$ and may be referred to as a "rotation axis direction" in some cases. The y-axis direction is an orthogonal direction orthogonal to the axial direction of the rotation axis $R_A$ and may be referred to a "rotation axis orthogonal direction" in some cases.

The micromirror device 10 has a substantially line symmetrical structure (horizontally symmetrical in FIG. 1) with respect to a center line CL which is parallel to the y-axis and passes through the center of the mirror part 12, as an axis of symmetry. Furthermore, the micromirror device 10 has a substantially line symmetrical structure (vertically symmetrical in FIG. 1) with the rotation axis $R_A$ as an axis of symmetry.

[Shape of Mirror Part]

The mirror part 12 of this example has a rectangular shape in a plan view. However, when the invention is implemented, the shape of the mirror part 12 is not particularly limited. The shape is not limited to the rectangular shape illustrated in FIG. 1, and there are various shapes including a circular shape, an elliptical shape, a square shape, a polygonal shape, and the like. Regarding the shape of the mirror part 12 in the plan view, the representation of a rectangular shape, a circular shape, an elliptical shape, a square shape, a polygonal shape, or the like is not limited to a shape based on the strict mathematical definition, and means a shape that can be substantially recognized as such a shape as an overall basic shape. For example, the concept of the term "quadrangle" includes rectangles with chamfered corner parts, those with round corner parts, those in which some or all of the sides are formed as a curved line or broken line, or those in which additional shapes necessary for connection are added to a connection portion between the mirror part 12 and the mirror support part 14. The same is applied to the representation of the other shapes.

Figure 2:
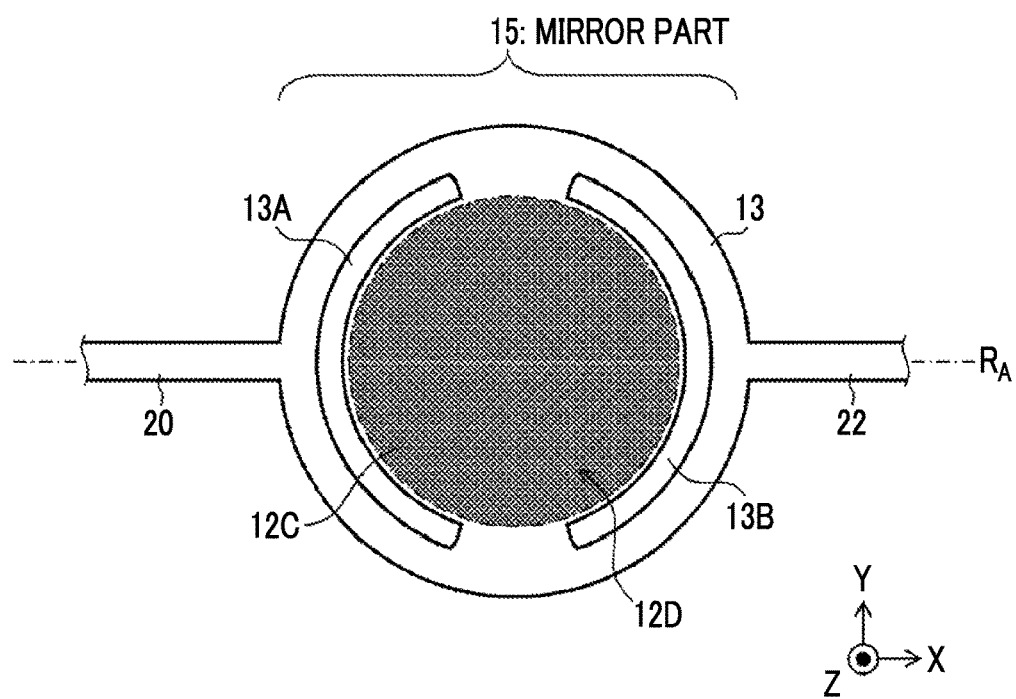
FIG. 2 is a plan view illustrating another form of a mirror part.

In addition, as an example of another functional shape that can be achieved by the mirror part, as described in JOURNAL OF MICROELECTROMECHANICAL SYSTEMS, Vol. 21, 6 (2012), 1303-1310, there may be cases where a deformation prevention frame which suppresses dynamic deformation of the reflecting surface during scan driving. For example, as illustrated in FIG. 2, as the first torsion bar part 20 and the second torsion bar part 22 as the mirror support part are connected to a deformation prevention frame 13 isolated from the outline of a reflecting part 12D having the reflecting surface 12C, the dynamic deformation of the reflecting surface 12C during scan driving can be significantly reduced. In this case, the combined structure of the deformation prevention frame 13 and the reflecting part 12D may be regarded as a "mirror part". The mirror part in FIG. 2 is denoted by reference numeral 15. The mirror part 15 has a structure in which the first torsion bar part 20 and the second torsion bar part 22 are connected to the deformation prevention frame 13 with slots 13A and 13B formed along the outer edge of the reflecting part 12D interposed therebetween. Instead of the mirror part 12 of FIG. 1, the mirror part 15 as illustrated in FIG. 2 can be employed.

[Structure of Piezoelectric Actuator Part]

As illustrated in FIG. 1, the piezoelectric actuator part 16 comprises a first actuator part 30 and a second actuator part 40. The first actuator part 30 and the second actuator part 40 are separately disposed on both sides in the y-axis direction orthogonal to the axial direction of the rotation axis $R_A$, with respect to the rotation axis $R_A$. The upper half of the piezoelectric actuator part 16 in FIG. 1 is the first actuator part 30, and the lower half is the second actuator part 40. That is, the first actuator part 30 is disposed on one side among regions divided by the rotation axis $R_A$ into both sides (upper and lower sides in FIG. 1) with the rotation axis $R_A$ in the y-axis direction interposed therebetween, and the second actuator part 40 is disposed on the other side. The y-axis direction corresponds to "an orthogonal direction which is a direction orthogonal to the film thickness direction of the piezoelectric body and orthogonal to the axial direction of the rotation axis".

As illustrated on the left side of FIG. 1, the first actuator part 30 is connected to one end of the first torsion bar part 20 via a connection part 32. The other end of the first torsion bar part 20 is connected to the mirror part 12. In addition, as illustrated on the right side of FIG. 1, the first actuator part 30 is connected to one end of the second torsion bar part 22 via a connection part 34. The other end of the second torsion bar part 22 is connected to the mirror part 12. The connection part 32 and the connection part 34 are members that connect the first actuator part 30 to the mirror support part 14. Each of the connection part 32 and the connection part 34 corresponds to a form of a "first connection part". Each of the connection portion 32A between the first actuator part 30 and the connection part 32 and a connection portion 34A between the first actuator part 30 and the connection part 34 corresponds to a form of a "first connection point". Otherwise, each of the connection part 32 and the connection part 34 can be interpreted as corresponding to a form of the "first connection point".

Each of first base end parts 36A and 36B which are base end parts on both sides in the rotation axis direction (x-axis direction) in the first actuator part 30 is fixed to the fixing frame 18. The first actuator part 30 is supported by the fixing frame 18 in a both-end supported beam structure by a configuration in which each of the first base end parts 36A and 36B is fixed to the fixing frame 18. The term "both-end supported beam structure" is synonymous with "doubly supported beam structure". The fixing frame 18 corresponds to a form of "fixing part".

The shape of the fixing frame 18 is not limited to the example of FIG. 1, and various forms of designs are possible. The fixing frame 18 may have a function of fixing the respective base end parts of the first actuator part 30 and the second actuator part 40. The fixing frame 18 may have a configuration divided into a plurality of members.

For example, instead of the fixing frame 18 illustrated in FIG. 1, there may be a frame structure divided into two members including a first fixing member to which the first base end part 36A and the second base end part 46A illustrated on the left side of FIG. 1 are fixed, and a second fixing member to which the first base end part 36B and the second base end part 46B illustrated on the right side of FIG. 1 are fixed. As another configuration example, there may be a frame structure divided into two members including a first fixing member to which the first base end parts 36A and 36B at both ends of the first actuator part 30 are fixed and a second fixing member to which the second base end parts 46A and 46B at the both ends of the second actuator part 40 are fixed. As still another configuration example, there may be a frame structure divided into four fixing members to which the first base end parts 36A and 36B and the second base end parts 46A and 46B are respectively fixed.

The first base end part 36A illustrated on the left side of FIG. 1 is positioned on the opposite side of the first actuator part 30 in the x-axis direction to the connection portion 32A for connection of the connection part 32 to the first actuator part 30. That is, in view of a relative positional relationship between the connection portion 32A for connection of the connection part 32 to the first actuator part 30, and the first base end part 36A, the connection portion 32A is positioned on the inside of the first actuator part 30, which is a side close to the mirror part 12 in the x-axis direction, and the first base end part 36A is positioned on the outside of the first actuator part 30, which is a side further away from the mirror part 12 than the connection portion 32A in the x-axis direction. In other words, in the x-axis direction from the center of the mirror part 12, the center position of the mirror part 12, the connection portion 32A, and the first base end part 36A are in a positional relationship so as to gradually be distant from the mirror part 12 in this order.

Similarly, the first base end part 36B illustrated on the right side of FIG. 1 is positioned on the opposite side of the first actuator part 30 in the x-axis direction to the connection portion 34A for connection of the connection part 34 to the first actuator part 30. That is, the connection portion 34A for connection of the first actuator part 30 to the connection part 34 is positioned on the inside of the first actuator part 30, which is the side close to the mirror part 12 in the x-axis direction, and the first base end part 36B is positioned on the outside of the first actuator part 30, which is the side further away from the mirror part 12 than the connection portion 34A in the x-axis direction. In other words, in the x-axis direction from the center of the mirror part 12, the center position of the mirror part 12, the connection portion 34A, and the first base end part 36B are in a positional relationship so as to gradually be distant from the mirror part 12 in this order.

The first actuator part 30 is a piezoelectric actuator having a both end fixed type both-end supported beam structure in which each of the first base end parts 36A and 36B positioned on both sides in the x-axis direction is restrained by the fixing frame 18.

Each of the first torsion bar part 20 and the second torsion bar part 22 is connected to the first actuator part 30 in the vicinity of the fixed end of the first actuator part 30, that is, in the vicinity of the first base end parts 36A and 36B, which are root portions where the first actuator part 30 starts to displace.

The same is applied to the second actuator part 40, and as illustrated on the left side of FIG. 1, the second actuator part 40 is connected to one end of the first torsion bar part 20 via the connection part 42. The other end of the second torsion bar part 22 is connected to the mirror part 12. In addition, as illustrated on the right side of FIG. 1, the second actuator part 40 is connected to the second torsion bar part 22 via the connection part 44. The connection part 42 and the connection part 44 are members that connect the second actuator part 40 to the mirror support part 14. Each of the connection part 42 and the connection part 44 corresponds to a form of "second connection part".

Each of the connection portion 42A between the second actuator part 40 and the connection part 42 and the connection portion 44A between the second actuator part 40 and the connection part 44 corresponds to a form of the "second connection point". Otherwise, each of the connection part 42 and the connection part 44 can be interpreted as corresponding to a form of "second connection point".

Each of the second base end parts 46A and 46B which are base end parts on both sides in the rotation axis direction (x-axis direction) in the second actuator part 40 is fixed to the fixing frame 18. That is, the second actuator part 40 is supported by the fixing frame 18 in a both-end supported beam structure by a configuration in which each of the second base end parts 46A and 46B is fixed to the fixing frame 18.

The second base end part 46A illustrated on the left side of FIG. 1 is positioned on the opposite side of the second actuator part 40 in the x-axis direction to the connection portion 42A for connection of the connection part 42 to the second actuator part 40. That is, in view of a relative positional relationship between the connection portion 42A for connection of the connection part 42 to the second actuator part 40, and the second base end part 46A, the connection portion 42A is positioned on the inside of the second actuator part 40, which is the side close to the mirror part 12 in the x-axis direction, and the second base end part 46A is positioned on the outside of the second actuator part 40, which is the side further away from the mirror part 12 than the connection portion 42A in the x-axis direction. In other words, in the x-axis direction from the center of the mirror part 12, the center position of the mirror part 12, the connection portion 42A, and the second base end part 46A are in a positional relationship so as to gradually be distant from the mirror part 12 in this order.

Similarly, the second base end part 46B illustrated on the right side of FIG. 1 is positioned on the opposite side of the second actuator part 40 in the x-axis direction to the connection portion 44A for connection of the connection part 44 to the second actuator part 40. The connection portion 44A for connection of the second actuator part 40 to the connection part 44 is positioned on the inside of the second actuator part 40, which is the side close to the mirror part 12 in the x-axis direction, and the second base end part 46A is positioned on the outside of the second actuator part 40, which is the side further away from the mirror part 12 than the connection portion 44A in the x-axis direction. In other words, in the x-axis direction from the center of the mirror part 12, the center position of the mirror part 12, the connection portion 44A, and the second base end part 46B are in a positional relationship so as to gradually be distant from the mirror part 12 in this order.

The second actuator part 40 is a piezoelectric actuator having a both end fixed type both-end supported beam structure in which both the second base end parts 46A and 46B on both sides in the x-axis direction are restrained by the fixing frame 18. Each of the first torsion bar part 20 and the second torsion bar part 22 is connected to the second actuator part 40 in the vicinity of the fixed end of the second actuator part 40, that is, in the vicinity of the second base end parts 46A and 46B, which are root portions where the second actuator part 40 starts to displace.

By causing the first actuator part 30 and the second actuator part 40 to bend in opposite directions, the first torsion bar part 20 and the second torsion bar part 22 are be moved in a direction in which they rotate about the rotation axis $R_A$, such that the mirror part 12 can be driven to be tilted. That is, by performing driving to bend the first actuator part 30 and the second actuator part 40 in opposite directions, the first torsion bar part 20 and the second torsion bar part 22 are induced to undergo tilt displacement, and the mirror part 12 Is rotated about the rotation axis $R_A$. That is, the reflecting surface 12C of the mirror part 12 is tilted.

«Shape of Piezoelectric Actuator Part»

Each of the first actuator part 30 and the second actuator part 40 in this example has an actuator shape with a substantially semicircular arc shape in a plan view, and the two are combined to form the piezoelectric actuator part 16 having a substantially annular shape. In FIG. 1, the piezoelectric actuator part 16 having an external shape with an elliptical ring shape slightly flattened from a true circle is illustrated. However, the actuator shape is not limited to the illustrated example. Each of the first actuator part 30 and the second actuator part 40 may have an arcuate actuator shape along a true circle or may have an actuator shape with an elliptical arc shape having a greater oblateness than the example of FIG. 1. Here, since a higher torque can be achieved by an actuator part with a larger area, an elliptical shape is more preferable than a true circle.

«Arrangement of Electrode Parts»

The first actuator part 30 has, as the upper electrodes thereof, one first electrode part 51 and two second electrode parts 52A and 52B. That is, the upper electrodes of the first actuator part 30 have an electrode arrangement structure in an electrode division form divided into the first electrode part 51 and the second electrode parts 52A and 52B with respect to the longitudinal direction of a beam along the shape of a movable part 38 corresponding to a portion of the beam (beam) that connects the one first base end part 36A and the other first base end part 36B. The first electrode part 51 and the second electrode parts 52A and 52B are electrodes that are independent (that is, insulated and separated) from each other.

When a length direction along the shape of the movable part 38 from the one first base end part 36A to the other first base end part 36B in the first actuator part 30 is referred to as the "length direction of the first actuator part 30", the first actuator part 30 has a structure in which the second electrode part 52A, the first electrode part 51, and the second electrode part 52B are sequentially arranged side by side along the length direction of the first actuator part 30 from the left in FIG. 1. An insulating part 55 is interposed between the second electrode part 52A and the first electrode part 51. An insulating part 57 is interposed between the first electrode part 51 and the second electrode part 52B.

The second actuator part 40 has, as the upper electrodes thereof, two third electrode parts 63A and 63B and one fourth electrode part 64. That is, the upper electrodes of the second actuator part 40 have an electrode arrangement structure in an electrode division form divided into the third electrode parts 63A and 63B and the fourth electrode part 64 with respect to the longitudinal direction of a beam along the shape of a movable part 48 corresponding to a portion of the beam (beam) that connects the one second base end part 46A and the other second base end part 46B.

The third electrode parts 63A and 63B and the fourth electrode part 64 are electrodes which are independent (that is, insulated and separated) from each other. When a length direction along the shape of the movable part 48 from the one second base end part 46A to the other second base end part 46B in the second actuator part 40 is referred to as the "length direction of the second actuator part 40", the second actuator part 40 has a structure in which the third electrode part 63A, the fourth electrode part 64, and the third electrode part 63B are sequentially arranged side by side along the length direction of the second actuator part 40 from the left in FIG. 1. An insulating part 65 is interposed between the third electrode part 63A and the fourth electrode part 64. An insulating part 67 is interposed between the fourth electrode part 64 and the third electrode part 63B.

Here, the electrode parts to which the same drive voltage is applied may be connected to each other via a wiring part (not illustrated). For example, the electrode parts to which the same drive voltage is applied, such as a set of the two second electrode parts 52A and 52B (pair), a set of the two third electrode parts 63A and 63B, a set of the first electrode part 51 and the third electrode parts 63A and 63B, or a set of the second electrode parts 52A and 52B and the fourth electrode part 64, may be connected to each other via a wiring part (not illustrated).

Details of the arrangement of the electrodes of the first electrode part 51, the second electrode parts 52A and 52B, the third electrode parts 63A and 63B, and the fourth electrode part 64 in the piezoelectric actuator part 16 will be described later.

<Second Embodiment>

Figure 3:
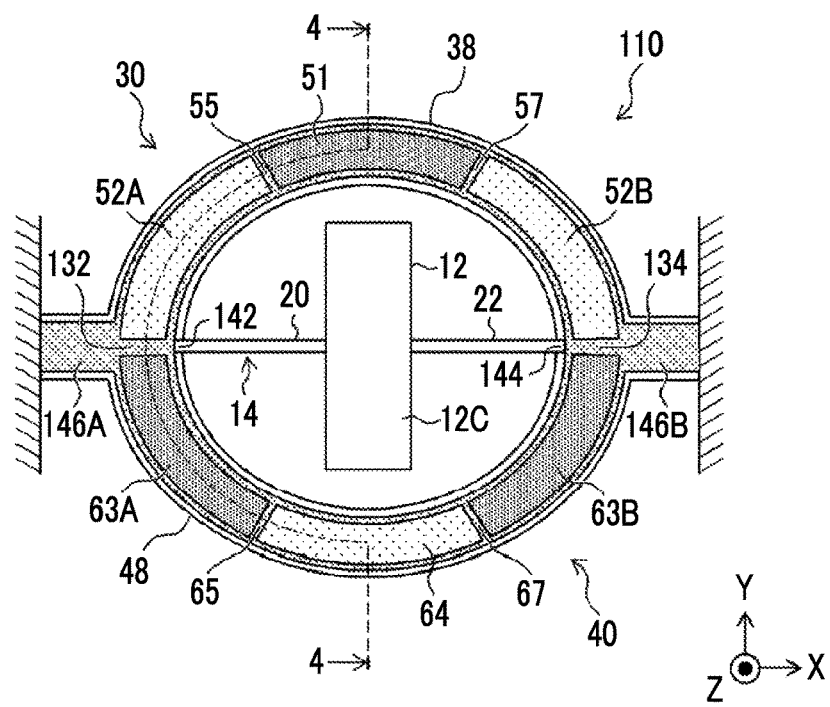
FIG. 3 is a plan view illustrating the configuration of main parts of a micromirror device according to a second embodiment.

FIG. 3 is a plan view illustrating the configuration of main parts of a micromirror device according to the second embodiment. In the micromirror device 110 illustrated in FIG. 3, like elements that are the same as or similar to those described with reference to FIG. 1 are denoted by like reference numerals, and description thereof will be omitted. In addition, in FIG. 3, illustration of the fixing frame 18 (see FIG. 1) is omitted. The micromirror device 110 corresponds to a form of "mirror driving device".

The micromirror device 110 illustrated in FIG. 3 has a structure in which the first actuator part 30 and the second actuator part 40 are connected to each other and the first base end part and the second base end part are integrated With the micromirror device 10 of FIG. 1.

That is, the piezoelectric actuator part 16 of the micromirror device 110 illustrated in FIG. 3 has an annular actuator shape in which the first actuator part 30 and the second actuator part 40 are connected to each other. In addition, the mirror support part 14 is connected to connection portions 132 and 134 of the first actuator part 30 and the second actuator part 40. The first torsion bar part 20 is connected to the connection portion 132 between the first actuator part 30 and the second actuator part 40, and the second torsion bar part 22 is connected to the connection portion 134 between the first actuator part 30 and the second actuator part 40.

In the example of FIG. 3, due to the structure in which the first actuator part 30 and the second actuator part 40 are connected to each other, the piezoelectric actuator part 16 having an external (outline) shape with an elliptical ring shape slightly flattened from a true circle in a plan view is formed.

The micromirror device 110 has a simple structure in which the connection parts 32, 34, 42, and 44 described with reference to FIG. 1 are omitted, and the mirror support part 14 is directly connected the connection portions 132 and 134 between the first actuator part 30 and the second actuator part 40. A connection point 142 between the first torsion bar part 20 and the piezoelectric actuator part 16 corresponds to a form of "first connection point" and corresponds to a form of "second connection point". Furthermore, the connection point 144 between the second torsion bar part 22 and the piezoelectric actuator part 16 corresponds to a form of the "first connection point" and corresponds to a form of the "second connection point".

Furthermore, in the micromirror device 110 in FIG. 3, a single (integrated) base end part 146A in which the first base end part 36A and the second base end part 46A described with reference to FIG. 1 are connected to each other is formed. The base end part 146A of FIG. 3 serves as the first base end part 36A described with reference to FIG. 1, and serves as the second base end part 46A. The same is applied to the base end part 146B on the right side of FIG. 3, and a single (integrated) base end part 146B in which the first base end part 36B and the second base end part 46B described with reference to FIG. 1 are connected to each other is formed. The base end part 146B of FIG. 3 serves as the first base end part 36B described with reference to FIG. 1, and serves as the second base end part 46B.

In the device structure of the second embodiment illustrated in FIG. 3, the shape of the device is simpler than that of the device structure of the first embodiment described with reference to FIG. 1, there is an advantage that the manufacturing process is easy and the yield is increased. On the other hand, as in the first embodiment described with reference to FIG. 1, the structure in which the first actuator part 30 and the second actuator part 40 are separated from each other and the first base end part 36A and 36B of the first actuator part 30 and the second base end parts 46A and 46B of the second actuator part 40 are separated from each other is also possible. By employing the structure as in the first embodiment, stress applied to each actuator part of the first actuator part 30 and the second actuator part 40 is reduced, and the device can be prevented from being broken even when the tilt angle of the mirror part 12 increases.

<Structure of Piezoelectric Actuator Part>

In the following description, the structure of the second embodiment having a simple device shape will be described as an example. However, the same description is applied to the structure of the first embodiment.

Figure 4:
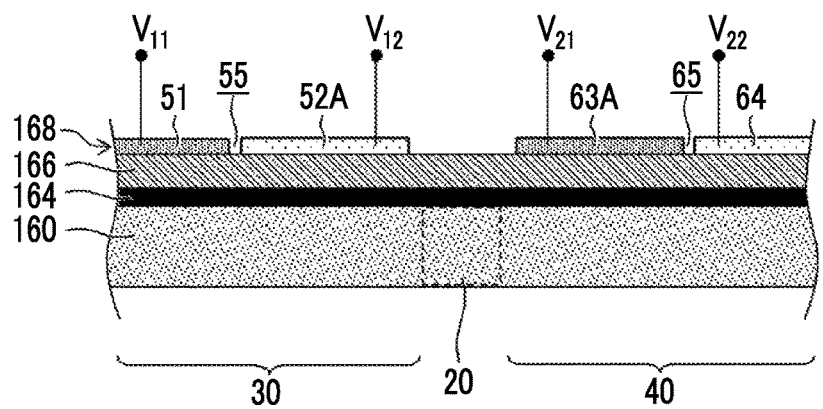
FIG. 4 is a schematic sectional view taken along line 4-4 of FIG. 3.

FIG. 4 is a schematic sectional view taken along line 4-4 of FIG. 3. As illustrated in FIG. 4, the first actuator part 30 and the second actuator part 40 are unimorph type thin film piezoelectric actuators having laminated structure in which a lower electrode 164, a piezoelectric body 166, and an upper electrode 168 are laminated in this order on a silicon (Si) substrate that functions as a vibration plate 160. The upper electrode 168 includes the first electrode part 51, the second electrode parts 52A and 52B, the third electrode parts 63A and 63B, and the fourth electrode part 64. However, in FIG. 4, the second electrode part 52B and the third electrode part 63B are not illustrated.

A piezoelectric conversion part is formed by a laminated structure in which the piezoelectric body 166 is interposed between the lower electrode 164 and the upper electrode 168. The piezoelectric conversion part is a portion that functions as a piezoelectric element and can also be expressed as the term "piezoelectric element part" or "piezoelectric active part". The piezoelectric conversion part can be used as a driving part for displacing the actuator part and can be used as a sensor part. Here, in order to simplify the description, a form in which the piezoelectric conversion part is used as a driving part will be described.

The first actuator part 30 and the second actuator part 40 function as piezoelectric unimorph actuators which undergo bending deformation in upward and downward directions in FIG. 4 due to the inverse piezoelectric effect of the piezoelectric body 166 by applying a voltage between the upper electrode 168 and the lower electrode 164.

The film thickness of the respective layers illustrated in FIG. 4 and other figures and ratios thereof are drawn as appropriate for convenience of description, and do not necessarily reflect actual film thicknesses or ratios. In this specification, in the expression of the laminated structure, "on" when "B is laminated on A" expresses a direction away from the surface of A in the thickness direction of the film as "on". In a case where B is configured to be superimposed on the upper surface of A in a state in which A is held horizontally, "on" is coincident with upward and downward directions when the direction of gravity is a downward direction. However, it is also possible to tilt the posture of A or to invert the posture upside down, and even in a case where the laminating direction of the laminated structure depending on the posture of the substrate or the film is not necessarily coincident with the upward and downward directions with respect to the direction of gravity, in order to represent the vertical relationship of the laminated structure without confusion, the surface of a certain reference member (for example, A) is used as the reference, and a direction away from the surface in the thickness direction is expressed as "on". In addition, the expression "B is laminated on A" is not limited to a case where B is directly laminated on A in contact with A, and may also include a case where a single or a plurality of layers are interposed between A and B and B is laminated on A with a single or a plurality of layers interposed therebetween.

<Description of Operation of Piezoelectric Actuator Part>

Next, the operation of the piezoelectric actuator part 16 will be described. Here, in order to simplify the description, a voltage waveform $V_{11}$ applied to the first electrode part 51 and a voltage waveform $V_{21}$ applied to the third electrode parts 63A and 63B are set to be the same voltage waveform $V_1$ ($V_{11}=V_{21}=V_1$), and a voltage waveform $V_{12}$ applied to the second electrode parts 52A and 52B and a voltage waveform $V_{22}$ applied to the fourth electrode part 64 are set to be the same voltage waveform $V_2$ ($V_{12}=V_{22}=V_2$). Furthermore, the voltage waveform $V_1$ and the voltage waveform $V_2$ have in an antiphase relationship in which a phase difference is 180° (see FIG. 5).

Figure 5:
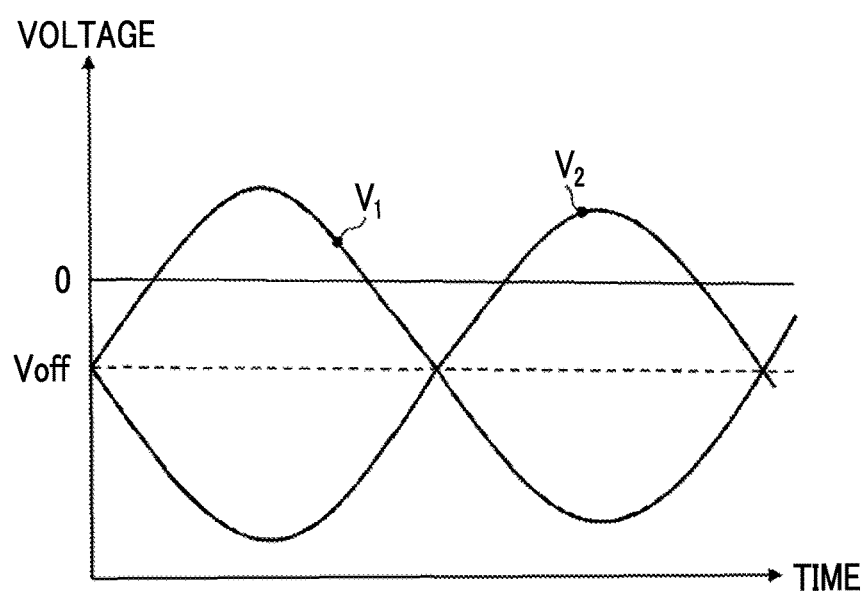
FIG. 5 is a waveform diagram showing an example of a voltage waveform.

FIG. 5 is a waveform diagram showing examples of the voltage waveform $V_1$ and the voltage waveform $V_2$. Here, sine waveforms are illustrated as examples of the voltage waveforms $V_1$ and $V_2$. As illustrated in FIG. 5, the voltage waveform $V_1$ and the voltage waveform $V_2$ are voltages which are in antiphase (phase difference $\phi=180°$) with each other, and the voltage waveforms $V_1$ and $V_2$ which are in antiphase with each other are applied to an electrode group of the first electrode part 51 and the third electrode parts 63A and 63B and an electrode group of the second electrode parts 52A and 52B and the fourth electrode part 64, described with reference to FIGS. 1 to 4.

The voltage waveforms $V_1$ and $V_2$ are respectively expressed as follows.

$$V_1 = V_{off1} + V_{1A} \sin \omega t$$

$$V_2 = V_{off2} + V_{2A} \sin(\omega t + \phi)$$

In the above expressions, $V_{1A}$ and $V_{2A}$ are the voltage amplitudes, ω is the angular frequency, t is the time, and φ is a phase difference.

In the example of FIG. 5, the voltage waveform which satisfies $V_{1A}=V_{2A}$ and $\phi=180°$ is applied. The offset voltages $V_{off1}$ and $V_{off2}$ are arbitrary. It is preferable to set the offset voltage such that, for example, $V_1$ and $V_2$ do not exceed the polarization reversal voltage of the piezoelectric body. The polarization reversal voltage is a voltage corresponding to the coercive electric field. In FIG. 5, the offset voltage $V_{off1}$ for the voltage waveform $V_1$ and the offset voltage $V_{off2}$ for the voltage waveform $V_2$ are the same voltage value $V_{off}$ ($=V_{off1}=V_{off2}$).

By applying the voltage waveforms $V_1$ and $V_2$ which are in antiphase as described above, the first actuator part 30 and the second actuator part 40 undergo bending deformation due to the inverse piezoelectric effect of the piezoelectric body 166. By causing the frequency of the voltage waveform to be coincident with a resonance frequency corresponding to a resonance mode in which the first torsion bar part 20 and the second torsion bar part 22 undergo tilt displacement, the mirror part 12 undergoes significant tilt displacement, and thus a wide range can be scanned.

In addition, in the example of FIG. 4, the piezoelectric layer may not be separated (divided) in units of the electrode part and may also be used as a single sheet of (single) piezoelectric film, but when the invention is implemented, the piezoelectric body 166 may be also divided according to the division form of the electrode part. Since a portion of the piezoelectric body 166 interposed between the upper and lower electrodes functions as a driving force generating part or a stress detection part (sensor part), unnecessary piezoelectric portions (such as portions that do not have the upper and lower electrodes) that do not directly contribute to the operation of the piezoelectric conversion part (piezoelectric element part) can be removed. By removing the unnecessary piezoelectric portions and separating the piezoelectric body in units of the piezoelectric conversion parts, the stiffness of the actuator part is lowered, and the actuator part can be easily deformed.

<Relationship Between Stress Distribution During Driving in Resonance Mode Vibration and Arrangement of Electrode Parts>

Figure 6:
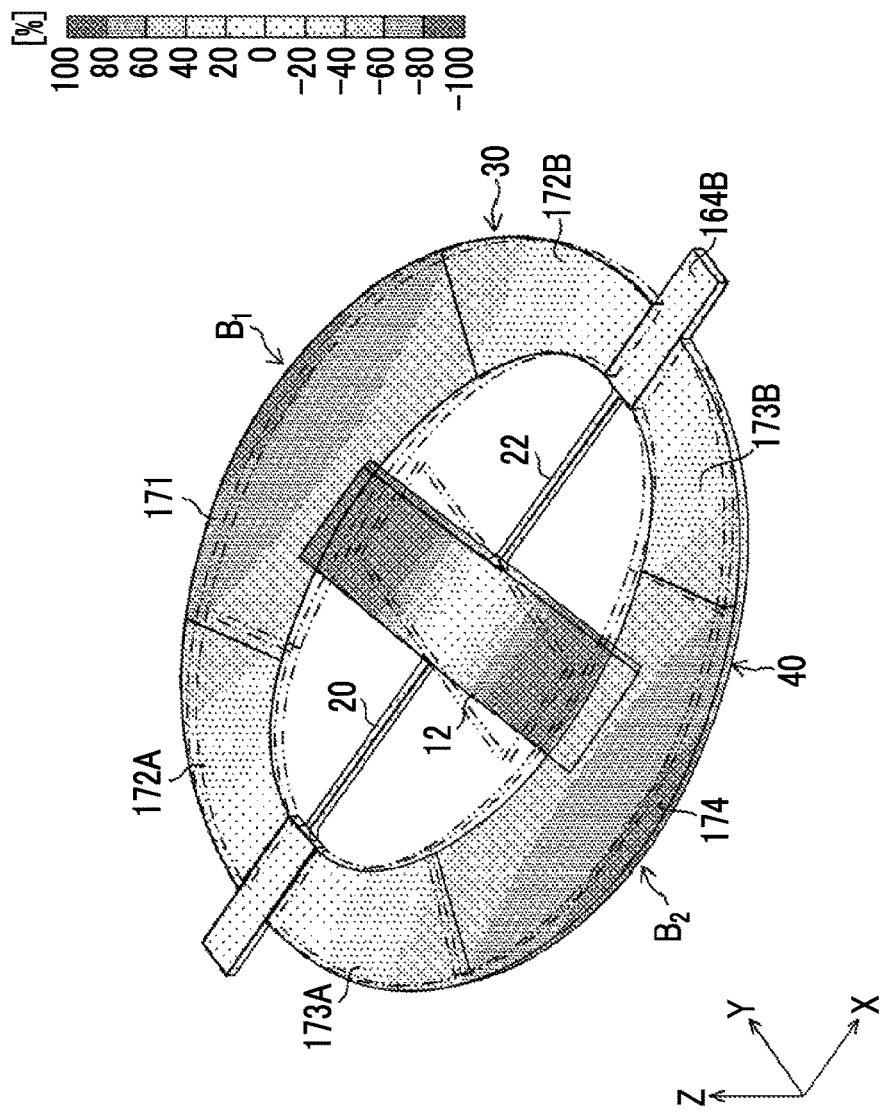
FIG. 6 is a perspective view schematically illustrating the distribution of displacements and principal stresses of a piezoelectric body during resonance driving.

FIG. 6 is a perspective view schematically illustrating the displacement distribution of the piezoelectric bodies of the first actuator part 30 and the second actuator part 40 during resonance driving. In FIG. 6, a form in which the first actuator part 30 is displaced in the "+z axis direction" and the second actuator part 40 is displaced in the "−z axis direction". Portions indicated by arrows $B_1$ and $B_2$ in FIG. 6 are portions with the largest actuator displacements in the z-axis direction.

In FIG. 6, for convenience of illustration, the relative displacement amount in the z-axis direction is indicated by a difference in dot screen pattern. In FIG. 6, regarding the denotement of the relative displacement amount in the z-axis direction, the maximum displacement amount (that is, the maximum value) in the +z axis direction is denoted by 100%, and the maximum displacement amount in the −z axis direction (that is, the minimum value) is denoted by −100%.

Figure 7:
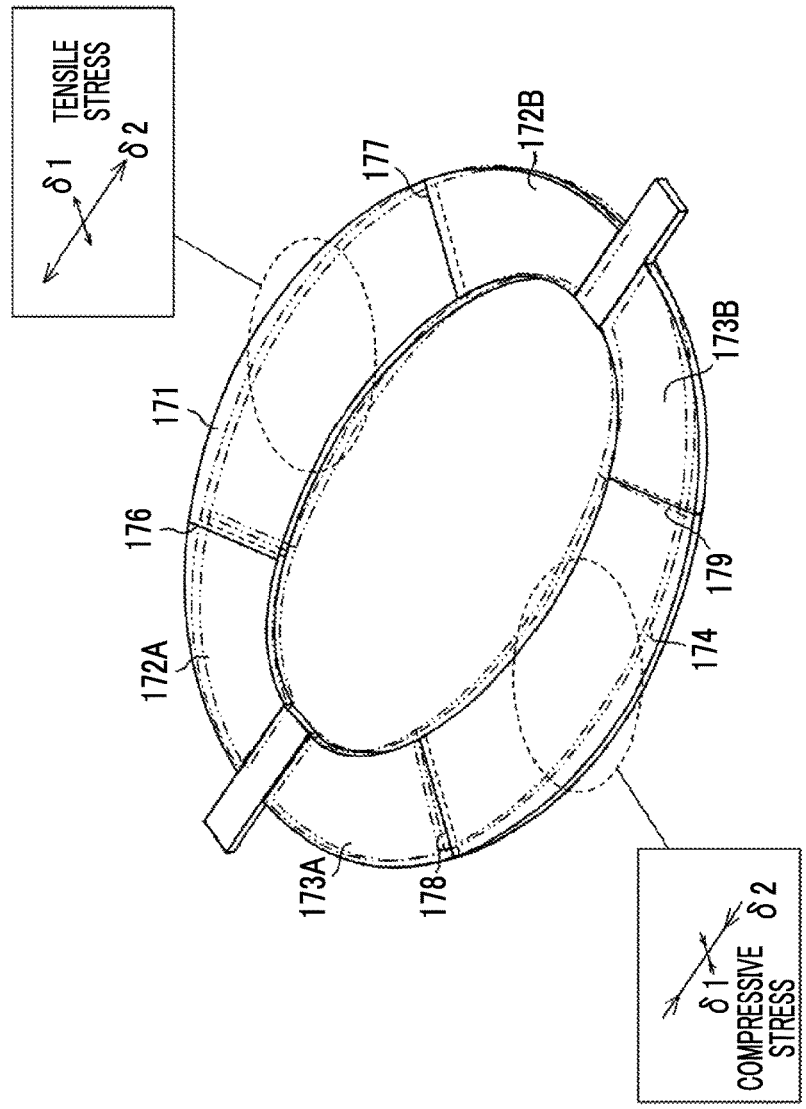
FIG. 7 is an explanatory view schematically illustrating stress directions in the piezoelectric body during resonance driving.

In addition, FIG. 7 schematically illustrates the distribution of the directions of the principal stresses in the piezoelectric bodies of the first actuator part 30 and the second actuator part 40 during the resonance driving illustrated in FIG. 6.

In a case where the first actuator part 30 and the second actuator part 40 are in the bending deformation state illustrated in FIGS. 6 and 7 in a state of being driven by the resonance mode vibration, in the piezoelectric body 166 inside the first actuator part 30 and the second actuator part 40, portions (reference numerals 171, 173A, and 173B) to which stress in a tensile direction (tensile stress) is applied, and portions (reference numerals 172A, 172B, and 174 in FIG. 7) to which stress in a compressive direction (compressive stress) is applied occur (see FIG. 6). On the basis of this stress distribution, the upper electrodes are divided so as to correspond to the division of the piezoelectric body regions in which stresses in opposite directions are generated, and each of the electrode parts (51, 63A, 63B, 52A, 52B, and 64) is disposed.

The "compressive stress" and the "tensile stress" mentioned here are defined by selecting two principal stresses in a plane substantially orthogonal to the film thickness direction of the piezoelectric body 166 from three orthogonal principal stress vectors and determining the direction with a higher absolute value (the direction with the maximum principal stress). In a case where the film thickness direction is set to the z axis, the two principal stresses in the plane substantially orthogonal to the film thickness direction are stresses generated in the x-y plane, and correspond to $\sigma_1$ and $\sigma_2$ in FIG. 7. Among the principal stress vectors in the x-y plane, the direction with the highest component absolute value is the direction of $\sigma_2$ in FIG. 7. As a method of denotement of the stress directions, a vector in a direction toward the outside is defined as the tensile direction, and a vector in a direction toward the inside is defined as the compressive direction.

The reason for the above definition is that the dimensions of the actuator part are generally planar in the piezoelectric MEMS device and the stress $\sigma_3$ in the film thickness direction can be regarded as almost 0. The phrase "the dimensions are planar" means that the height is sufficiently smaller than the dimension in the plane direction. The term "stresses in opposite directions" is determined on the basis of the above definition. The plane direction of the "x-y plane" described above corresponds to the "in-plane direction orthogonal to the film thickness direction of the piezoelectric body".

In addition, in FIG. 7, in boundary portions (reference numerals 176, 177, 178, and 179) between the tensile stress regions 171, 173A, and 173B which are portions where stress in the tensile direction is generated and the compressive stress regions 172A, 172B, and 174 which are portions where stress in the compressive direction is generated, intermediate regions which are transitional regions in which the direction of stress gradually (continuously) changes are present.

According to the stress distribution as illustrated in FIG. 7, the first electrode part 51, the second electrode parts 52A and 52B, the third electrode parts 63A and 63B, and the fourth electrode part 64 are respectively disposed on the regions (reference numerals 171, 172A, 172B, 173A, 173B, and 174) of the piezoelectric parts having different stress directions.

That is, the first electrode part 51 is provided for the tensile stress region 171 in FIG. 7, the second electrode part 52A is provided for the compressive stress region 172A, and the second electrode part 52B is provided for the compressive stress region 172B. Similarly, the third electrode part 63A is provided for the tensile stress region 173A, the third electrode part 63B is provided for the tensile stress region 173B, and the fourth electrode part 64 is provided for the compressive stress region 174. The insulating parts 55, 57, 65, and 67 (see FIG. 3) are formed to respectively correspond to the intermediate regions 176, 177, 178, and 179.

The stress distribution during an operation due to resonance mode vibration (resonance driving) can be analyzed by using a mode analysis method with parameters such as device dimensions, the Young's modulus of a material, and device shapes, which are given by using a well-known finite element method software. When the device is designed, the stress distribution in the piezoelectric body at the time of driving in the resonance mode is analyzed, the regions of the upper electrodes are divided so as to correspond to the division of the compressive stress regions and the tensile stress regions in the stress distribution on the basis of the analysis result, and the arrangement of the first electrode part 51, the second electrode parts 52A and 52B, the third electrode parts 63A and 63B, and the fourth electrode part 64 is determined.

In addition, from the viewpoint of groups of the electrode parts corresponding to regions with common stress directions, the electrode parts can be divided into two groups. The first electrode part 51 and the third electrode parts 63A and 63B belong to a first group (first electrode group), the second electrode parts 52A and 52B and the fourth electrode part 64 belong to a second group (second electrode group).

In the arrangement of the electrode parts divided as described above, the drive voltages in phase are applied to the electrode parts corresponding to the region with the same stress direction, and the drive voltages in different phases (preferably, in antiphase) are applied to the electrode parts corresponding to the region of different stress directions (stresses in opposite directions). Accordingly, in the most efficient manner, a piezoelectric force can be converted into tilt displacement.

In the first actuator, as illustrated in FIG. 7, by arranging the first electrode part and the second electrode part so as to correspond to portions where the generated stress directions are different, the piezoelectric force can be converted into displacement in the most efficient manner. Similarly, in the second actuator, by arranging the third electrode part and the fourth electrode part according to the generated stress directions, the piezoelectric force can be also converted into displacement in the most efficient manner.

Furthermore, in FIGS. 3 and 4, the example in which the voltage waveform $V_1$ is applied to the first electrode part 51 and the third electrode parts 63A and 63B and the voltage waveform $V_2$ which is in antiphase with $V_1$ is applied to the second electrode parts 52A and 52B and the fourth electrode part 64 is illustrated. However, the voltage waveform $V_2$ may also applied to the first electrode part 51 and the third electrode parts 63A and 63B and the voltage waveform $V_1$ may also be applied to the second electrode parts 52A and 52B and the fourth electrode part 64.

Furthermore, in addition to the embodiment in which all of the first electrode part 51, the second electrode parts 52A and 52B, the third electrode parts 63A and 63B, and the fourth electrode part 64 are used as electrodes for driving, an embodiment in which some electrode parts thereof are used as electrodes for sensing (for detection) is also possible. Moreover, each of the electrode parts (51, 52A, 52B, 63A. 63B, and 64) is not limited to an embodiment constituted by a single electrode, and at least one electrode part among the electrode parts (51, 52A, 52B, 63A, 63B, and 64) may also be constituted by a plurality of electrodes.

<Use Form and Modification Example of Device>

Hereinafter, an example of a driving method of the micromirror device according to the embodiment of the present invention will be described.

USE EXAMPLE 1

Figure 8:
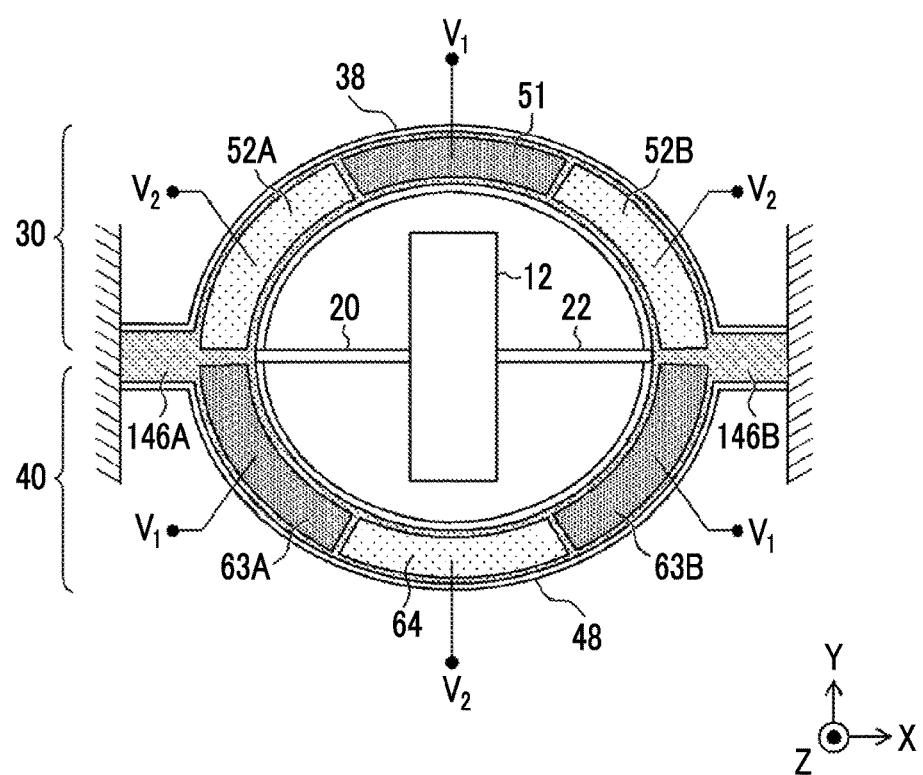
FIG. 8 is an explanatory view of a voltage application method in a case where all electrode parts are used as electrodes for driving in the device structure of FIG. 3.

FIG. 8 shows an example in which all electrode parts of the first electrode part 51, the second electrode parts 52A and 52B, the third electrode parts 63A and 63B, and the fourth electrode part 64 are used as electrodes for driving. Portions of each of the electrode parts (51, 52A, 52B, 63A, 63B, and 64) as the upper electrodes 168 and the lower electrodes 164 (see FIG. 4) with the piezoelectric body 166 interposed therebetween each operate as a piezoelectric element part. In this example, all the electrode parts are used as the electrodes for driving (driving electrodes), and all the piezoelectric element parts function as driving force generating parts.

In this case, as illustrated in FIG. 8, the same voltage waveform $V_1$ is applied to the electrode group of the first electrode part 51 of the first actuator part 30 and the third electrode parts 63A and 63B of the second actuator part 40, and a voltage waveform $V_2$ which is in antiphase with $V_1$ is applied to the electrode group of the second electrode part 52A and 52B of the first actuator part 30 and the fourth electrode parts 64 of the second actuator part 40. By using all of the respective piezoelectric element parts corresponding to the respective electrode parts (51, 52A, 52B, 63A, 63B, and 64) as the driving force generating parts, a large displacement angle can be realized.

It addition, the phrase "in phase" is not limited to a phase difference of 0° and includes an allowable range of a phase difference (for example, ±10°) that can be substantially treated as the same phase to a degree at which no problems are caused in practice. Moreover, the phrase "antiphase" is not limited to a phase difference of 180° and includes an allowable range of a phase difference (for example, 180°±10°) that can be substantially treated as an antiphase to a degree at which no problems are caused in practice.

For the plurality of piezoelectric element parts that function as the driving force generating parts, in order to adjust the operation performance between the elements, the voltage amplitude and the phase difference of the drive voltage applied to each piezoelectric element part may be appropriately adjusted. A case of changing the voltage amplitude and the phase difference within the range of such adjustment is also included in the scope of the implementation of the present invention.

USE EXAMPLE 2

Figure 9:
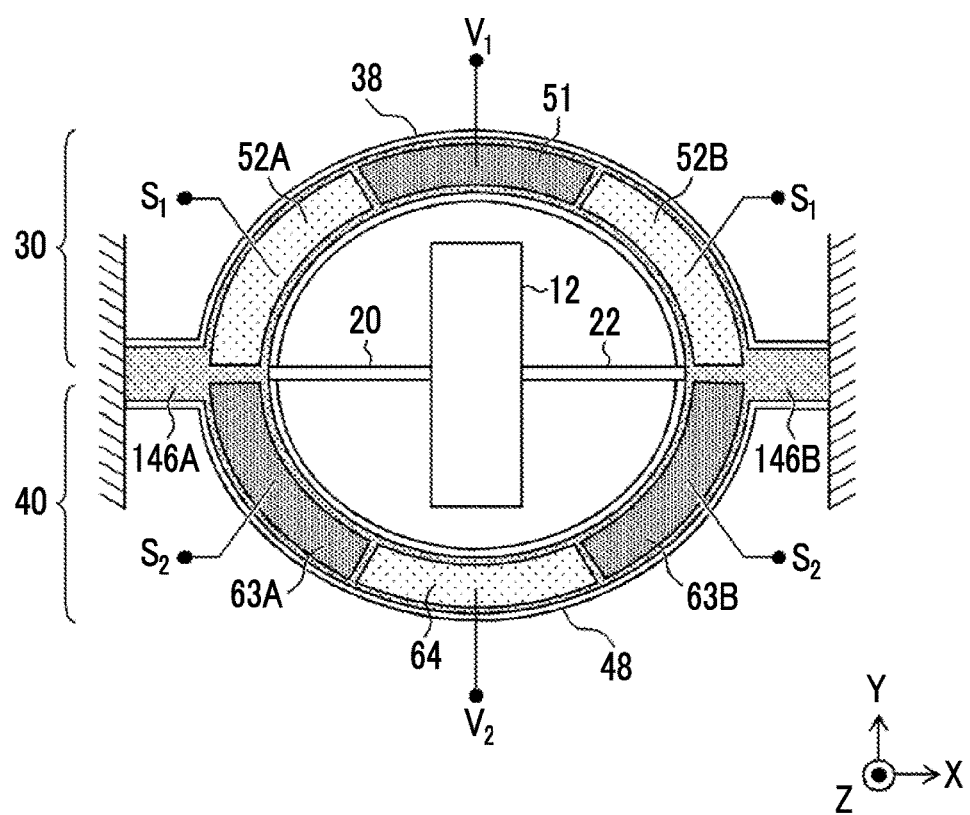
FIG. 9 is an explanatory view of a form in which some of electrode parts are used for sensing in the device structure of FIG. 3.

FIG. 9 shows an example in which some electrode parts of the first electrode part 51, the second electrode parts 52A and 52B, the third electrode parts 63A and 63B, and the fourth electrode part 64 are used to sensing (detection) electrodes for stress detection. When an electrically open state (that is, synonymous with "open state") is set between the upper electrode the lower electrode as an electrode pair of the piezoelectric conversion parts, stress during driving can be detected by detecting a potential difference generated by a positive piezoelectric effect of the piezoelectric body 166.

In FIG. 9, an example in which the second electrode parts 52A and 52B and the third electrode parts 63A and 63B are used as detection electrodes, and the other electrode parts are used as electrodes for driving is illustrated.

The detection electrode is set to be at a floating potential, and detects a voltage generated by the piezoelectric effect (positive piezoelectric effect) of the piezoelectric body 166. In FIG. 9, the electrodes indicated by "$s_1$," and "$s_2$," are detection electrodes for extracting a signal for sensing and represent electrodes set to be at a floating potential. Setting at the floating potential is synonymous with setting to the electrically open state.

As described above, when some electrode parts among the plurality of electrode parts are used as voltage detection parts, a voltage generated by the positive piezoelectric effect of the piezoelectric body can be detected, and from the detected voltage signal (detection signal), the stress of the actuator part can be detected. That is, the voltage detection part functions as a stress detection part. Accordingly, a feedback driving circuit that monitors the driven state of the mirror part 12 during driving of the mirror part 12 and enables the resonance state to be maintained or the like can be configured.

As illustrated in FIG. 9, it is preferable that at least one voltage detection part is provided for each of the actuator parts (30 and 40) constituting the piezoelectric actuator part 16. As described above, by providing the voltage detection part for each of the actuator parts, the operation state of each of the actuator parts can be recognized. Therefore, control on the application of an appropriate drive voltage based on the detection signal can be achieved, and more stable resonance driving can be realized.

USE EXAMPLE 3

Figure 10:
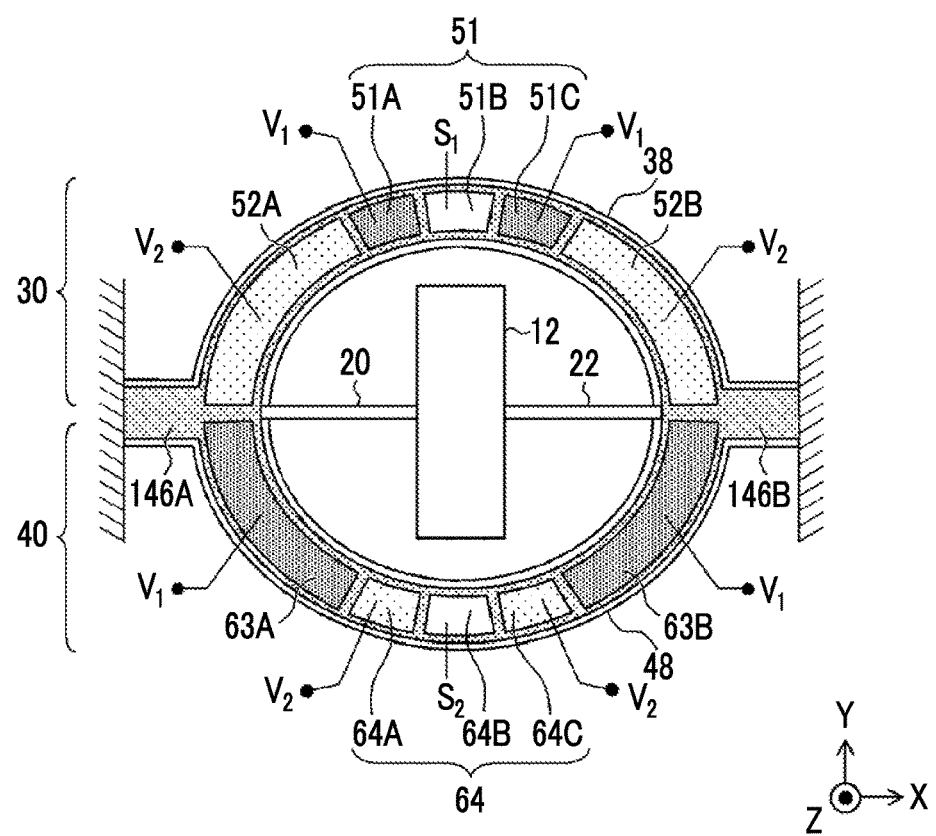
FIG. 10 is an explanatory view of a form in which some of electrodes among a plurality of electrodes constituting the electrode parts are used for sensing in the device structure of FIG. 3.

FIG. 10 shows an example in which each of the first electrode part 51 and the fourth electrode part 64 described with reference to FIG. 8 is further divided into a plurality of electrodes. In FIG. 10, an example in which the first electrode part 51 is divided into three electrodes 51A, 51B, and 51C in the length direction of the first actuator part 30, and the fourth electrode part 64 is divided into three electrodes 64A, 64B, and 64C in the length direction of the second actuator part 40 is illustrated.

Among the plurality of electrodes 51A to 51C constituting the first electrode part 51, the electrode 51B disposed at the center is used as a voltage detection part (electrode for sensing) at a floating potential, and the remaining (left and right) electrodes 51A and 51C are used as drive voltage application parts (that is, driving force generating parts).

Similarly, among the plurality of electrodes 64A to 64C constituting the fourth electrode part 64, the electrode 64B disposed at the center is used as a voltage detection part (electrode for sensing) at a floating potential and the remaining (left and right) electrodes 64A and 64C are used as drive voltage application parts (that is, driving force generating parts).

Accordingly, stress detection can be achieved while minimizing the electrode region occupied by the voltage detection parts and maintaining a high scan angle.

In FIG. 10, a form in which each of the first electrode part 51 and the fourth electrode part 64 is further divided is illustrated. Alternatively, or in combination therewith, a form in which the second electrode parts 52A and 52B and the third electrode parts 63A and 63B are further divided into a plurality of electrodes is also possible. As described above, by further dividing any one of the first electrode part 51 to the fourth electrode part 64, using any thereof as a stress detection part, and using the remainder as voltage application parts, stress detection can be achieved while minimizing portions occupied by stress detection and maintaining a high scan angle.

<Production Method of Example 1>

As Example 1, a micromirror device was fabricated by the following production method.

[Procedure 1] On a silicon on insulator (SOI) substrate having a laminated structure of a handle layer of 350 micrometers [μm], a box layer of 1 micrometer [μm], and a device layer of 24 micrometers [μm], a Ti layer of 30 nanometers [nm] and an Ir layer of 150 nanometers [nm] were formed at a substrate temperature of 350° C. by a sputtering method. A conductive layer formed by the laminate of the Ti layer (30 nm) and the Ir layer (150 nm) corresponds to the "lower electrode 164" described with reference to FIG. 4.

[Procedure 2] A piezoelectric body (PZT) layer was formed into 2.5 micrometers [μm] on the substrate in which the laminate of the lower electrode (Ti/Ir) was formed in Procedure 1, by sing a radio frequency (RF) sputtering device.

A mixed gas of 97.5% Ar and 2.5% $O_2$ was used as the film formation gas, and a target material having a composition of $Pb_{1.3}((Zr_{0.52}\ Ti_{0.48})_{0.88}Nb_{0.12})O_3$ was used. The film formation pressure was set to 2.2 millitorr [mTorr] (about 0.293 Pa), and the film formation temperature was set to 450° C. The obtained PZT layer was an Nb-doped PZT thin film to which Nb was added in an atomic compositional ratio of 12%.

The compositional ratio of Pb contained in the formed PZT thin film was measured by an X-ray fluorescence analysis (XRF) method, and the molar ratio Pb/(Zr+Ti+Nb) was 1.05. That is, the chemical formula at this time is a=1.05 with "b=1" represented in $Pb_a(Zr_x Ti_y Nb_{b-x-y})_b O_c$.

As described above, the ratio of the amount "a" of Pb contained in the PZT thin film having a perovskite structure that is actually obtained can take a value other than "1.00" due to the presence of interstitial atoms, defects, and the like. In addition, for the same reason, the ratio c of O atoms can also take a value other than "3.00".

[Procedure 3] On the substrate on which the PZT layer is formed in procedure 2, an upper electrode having a laminated structure of Pt/Ti was patterned by a lift-off method, pattern etching of the PZT thin film was performed by ICP (inductively coupled plasma) dry etching.

[Procedure 4] Thereafter, pattern etching of the device layer was performed by a silicon dry etching process, and the shapes of the actuator part, the mirror part, and the fixing frame were processed.

[Procedure 5] Next, the handle layer was subjected to deep reactive-ion etching (Deep RIE) from the rear surface of the substrate.

[Procedure 6] Last, the box layer was removed from the rear surface by dry etching, whereby a micromirror device having the configuration as illustrated in FIG. 3 was fabricated.

In this example, the PZT thin film was directly formed on the substrate by the sputtering method, and the dry etching was thereafter performed. As described above, by thinning the piezoelectric body, the fabrication process can be simplified and fine patterning can be achieved. Accordingly, the yield can be significantly improved, a further reduction in the size of the device can be coped with.

However, when the present invention is implemented, the piezoelectric body of the actuator part is not limited to the thin film piezoelectric body, and a unimorph actuator may be formed by attaching a bulk piezoelectric body to a vibration plate or a bimorph actuator may be formed by attaching piezoelectric bodies having two different polarities to each other.

<Examples of Dimensions of Example 1>

Figure 11:
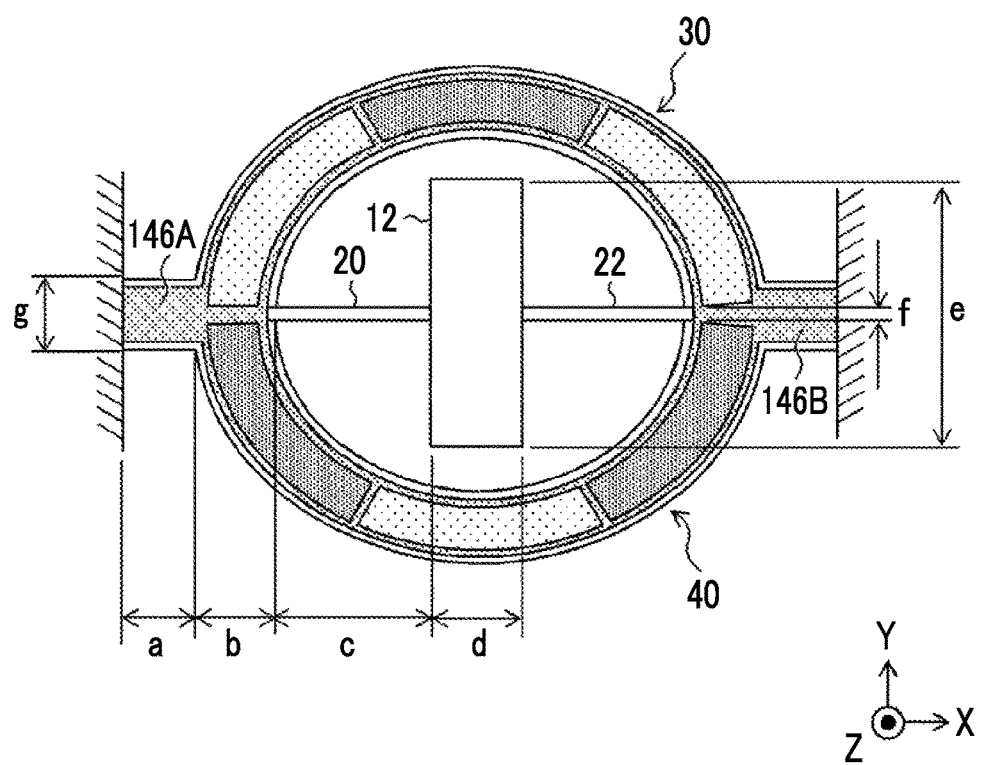
FIG. 11 is an explanatory view illustrating an example of dimensions of a device of Example 1.

As an example of the shape of the device according to Example 1, specific examples of dimensions of Example 1 are illustrated in FIG. 11. For the dimensions a to g illustrated in FIG. 11, a=0.05 mm, b=1.0 mm, c=4.0 mm, d=1.32 mm, e=2.96 mm, f=0.08 mm, and g=0.48 mm are given. At this time, the resonance frequency of a resonance mode used for scanning is around 3400 Hz.

The dimension a is the length in the x-axis direction of the base end parts (164A and 164B). The dimension b is the width dimension in the x-axis direction of the beam (beam) portions in the actuator parts (30 and 40). The dimension c is the length in the x-axis direction of the torsion bar parts (20 and 22). The dimension d is the width dimension in the x-axis direction of the mirror part 12. The dimension e is the length of the mirror part 12 in the y-axis direction. The dimension f is the width dimension in the y-axis direction of the torsion bar parts (20 and 22). The dimension g is the width dimension in the y-axis direction of the base end parts (146A and 146B).

COMPARATIVE EXAMPLE 1

Figure 12:
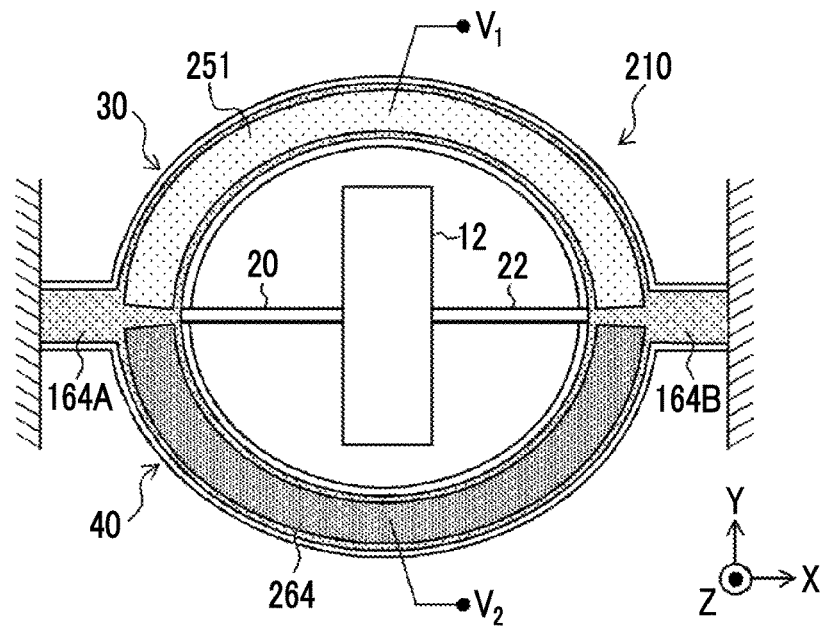
FIG. 12 is a plan view illustrating the configuration of main parts of a micromirror device according to Comparative Example 1.

A micromirror device according to Comparative Example 1 as illustrated in FIG. 12 was fabricated using exactly the same substrate (SOI substrate) and production process method as those in Example 1.

In the device 210 illustrated in FIG. 12, like elements that are the same as or similar to those described with reference to FIG. 3 are denoted by like reference numerals, and description thereof will be omitted. The device 210 of Comparative Example 1 illustrated in FIG. 12 has a structure in which the upper electrodes of the first actuator part 30 and the second actuator part 40 have only a single electrode part 251 and a single electrode part 264, respectively. FIG. 12 shows an example in which these two electrode parts 251 and 264 are used as electrodes for driving. A voltage waveform $V_1$ may be applied to the electrode part 251 of the first actuator part 30, and a voltage waveform $V_2$ which is in antiphase with $V_1$ may be applied to the electrode part 264 of the second actuator part 40.

Figure 13:
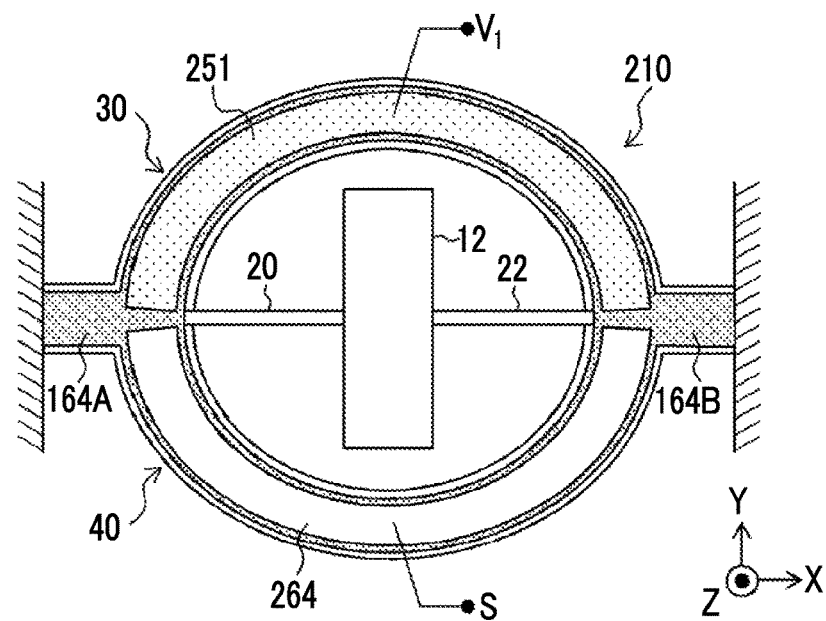
FIG. 13 is an explanatory view of a form in which sensing is performed in the device structure of FIG. 12.

In a case of where stress detection is performed in the device form illustrated in FIG. 12, as illustrated in FIG. 13, any one electrode part of the two electrode parts 251 and 264 is used for detection (sensing). FIG. 13 shows an example in which the electrode part 264 of the second actuator part 40 is used for sensing. The electrode part 264 used for sensing is set to be at a floating potential and detects a voltage generated by a positive piezoelectric effect of the piezoelectric body. In FIG. 13, the electrode indicated by "s" is a detection electrode for extracting a signal for sensing and represents an electrode set to be at a floating potential.

<Evaluation Experiment on Operation of Device>

Figure 14:
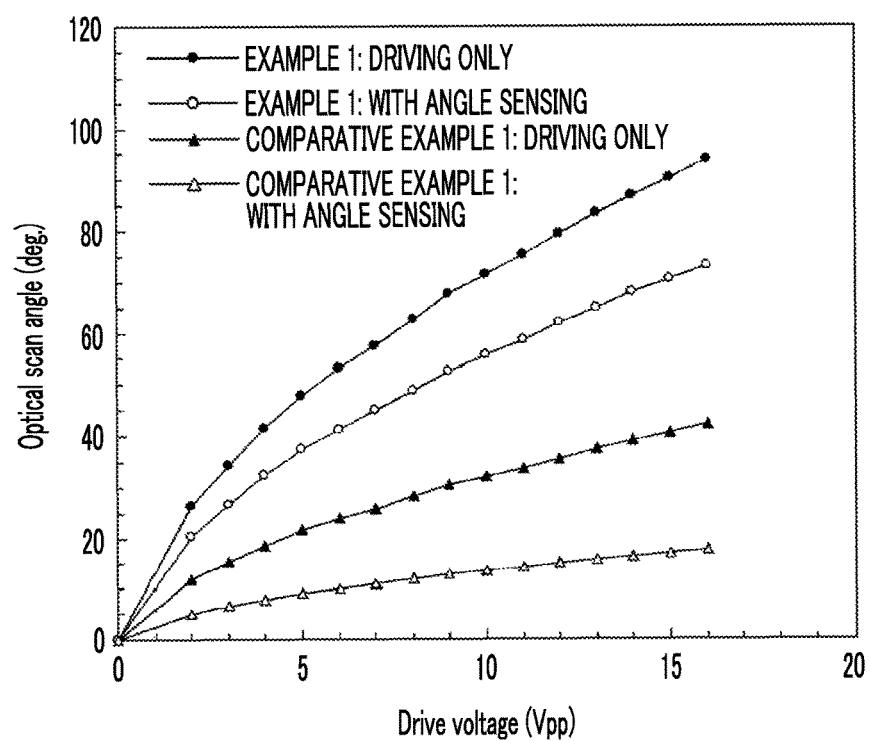
FIG. 14 is a graph showing the relationship between an application voltage and an optical scan angle in Example 1 and Comparative Example 1.

An experiment was conducted to compare the operation performance of the device fabricated in Example 1 and the device fabricated in Comparative Example 1. FIG. 14 is a graph showing the relationship between the drive voltage and the scan angle in the device as an experiment subject.

As experiment subjects, four types of devices, "Example 1 (driving only)", "Example 1 (with angle sensing)", "Comparative Example 1 (driving only)", and "Comparative Example 1 (with angle sensing) evaluated. "Example 1 (driving only)", "Example 1 (with angle sensing)", "Comparative Example 1 (driving only)", and "Comparative Example 1 (with angle sensing) respectively correspond to forms of FIGS. 8, 9, 12, and 13.

Furthermore, the dimensions of the device are all exemplified in FIG. 11.

The voltage waveforms $V_1$ and $V_2$ in a sine wave having a voltage amplitude $V_{PP}$ are input to the electrode parts for driving in each device to induce resonance vibration accompanied with the rotational motion of the mirror part 12, and the mechanical deflection angle of the mirror part 12 was measured at a laser scan angle. Regarding a method of applying the drive voltage, the devices of "Example 1 (driving only)" and "Example 1 (with angle sensing)" conform to the illustration of FIGS. 8 and 9, respectively. The devices of "Comparative Example 1 (driving only)" and "Comparative Example 1 (with angle sensing)" conform to the illustration of FIGS. 12 and 13, respectively.

The results of the experiment are shown in FIG. 14. In FIG. 14, the horizontal axis represents the voltage amplitude (in units of volts [V]), and the vertical axis represents the optical scan angle (in units of degrees [deg]).

As is apparent from FIG. 14, the device of Example 1 including a plurality of electrode parts in a single actuator part has a higher scan angle than that of the device of Comparative Example 1. In addition, even in a case where a stress detection part which uses some of the electrode parts for sensing was provided, it was confirmed that the device of Example 1 can maintain a higher scan angle than that of the device of Comparative Example 1.

<Piezoelectric Material>

A piezoelectric body suitable for this embodiment may be a body including one or two or more perovskite type oxides represented by the following general formula (P-1).

General formula $ABO_3$      (P-1)

In the formula, A is an element in A-site and is at least one element including Pb.

B is an element in B-site and is at least one element selected from the group consisting of Ti, Zr, V, Nb, Ta, Sb, Cr, Mo, W, Mn, Sc, Co, Cu, In, Sn, Ga, Zn, Cd, Fe, Mg, Si, and Ni.

O is an oxygen element.

The molar ratio between the A-site element, the B-site element, and the oxygen element is 1:1:3 as a standard, and the molar ratio may also be deviated from the reference molar ratio within a range in which the perovskite structure can be achieved.

The perovskite type oxides represented by the above general formula (P-1) include: lead-containing compounds such as lead titanate, lead zirconate titanate (PZT), lead zirconate, lanthanum lead titanate, lead lanthanum zirconate titanate, lead magnesium niobate-lead zirconate titanate, lead nickel niobate-lead zirconate titanate, and lead zinc niobate-lead zirconate titanate and mixed crystal systems thereof, and lead-free compounds such as barium titanate, strontium barium titanate, sodium bismuth titanate, bismuth potassium titanate, sodium niobate, potassium niobate, lithium niobate, and bismuth ferrite and mixed crystal systems thereof.

In addition, the piezoelectric film of this embodiment preferably includes one or two or more perovskite type oxides (P-2) represented by the following general formula (P-2).

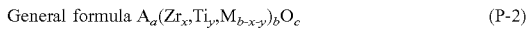

General formula $A_a(Zr_x,Ti_y,M_{b-x-y})_bO_c$      (P-2)

In the formula, A is an element in A-site and is at least one element including Pb.

M is at least one element selected from the group consisting of V, Nb, Ta, and Sb.

$0<x<b$, $0<y<b$, and $0 \leq b-x-y$ are satisfied.

$a:b:c=1:1:3$ is standard, and the molar ratio may be deviated from the reference molar ratio within a range in which the perovskite structure can be achieved.

The perovskite type oxide (P-2) is an oxide in which a part of the B-site of intrinsic PZT or PZT is substituted with M. It is known that in the PZT to which various donor ions having a valence higher than the valence of the substituted ion are added, characteristics such as piezoelectric performance are improved compared to the intrinsic PZT. It is preferable that M is one or two or more donor ions having a valence higher than that of tetravalent Zr or Ti. As such donor ions, there are $V^{5+}$, $Nb^{5+}$, $Ta^{5+}$, $Sb^{5+}$, $Mo^{6+}$, and $W^{6+}$.

The range of $b-x-y$ is not particularly limited as long as the perovskite structure can be achieved. For example, in a case where M is Nb, the molar ratio Nb/(Zr+Ti+Nb) is preferably 0.05 or more and 0.25 or less, and more preferably 0.06 or more and 0.20 or less.

Since a piezoelectric film made of the perovskite type oxides represented by the above general formulas (P-1) and (P-2) has a high piezoelectric strain constant (d31 constant), a piezoelectric actuator comprising the piezoelectric film has excellent displacement characteristics.

Furthermore, the piezoelectric actuator comprising the piezoelectric film made of the perovskite type oxides represented by the general formulas (P-1) and (P-2) has voltage-displacement characteristics with excellent linearity.

These piezoelectric materials exhibit good actuator characteristics and sensor characteristics when the present invention is implemented. In addition, the perovskite type oxide represented by the general formula (P-2) has a higher piezoelectric constant than that represented by the general formula (P-1).

As a specific example of the piezoelectric body in this embodiment, for example, a lead zirconate titanate (PZT) thin film doped with Nb in an atomic composition percentage of 12% may be used. By forming a film of PZT doped with 12% Nb by a sputtering method or the like, a thin film having piezoelectric characteristics as high as a piezoelectric constant of d31=250 pm/V can be stably fabricated.

In addition, in this example, PZT is selected as the piezoelectric material used for the actuator part (the driving force generating part and the stress detection part), but the piezoelectric material does not need to be limited to this material. For example, a lead-free piezoelectric body such as $BaTiO_3$, $KNaNbO_3$, or $BiFeO_3$ may be used, and a non-perovskite piezoelectric body such as AlN and $ZnO_2$ may also be used.

<Film Formation Method>

A vapor deposition method is preferable as the film formation method of the piezoelectric body. For example, in addition to the sputtering method, various methods such as an ion plating method, a metal organic chemical vapor deposition (MOCVD) method, and a pulse laser deposition (PLD) method may be applied. It is also conceivable to use a method other than the vapor deposition method (for example, sol-gel method). A configuration in which a piezoelectric thin film is directly formed on a substrate by a vapor deposition method or a sol-gel method is preferable. In particular, the piezoelectric body 166 of this embodiment is preferably a thin film having a film thickness of 1 μm or more and 10 μm or less.

<Waveforms of Drive Voltages>

In Example 1 described above, as illustrated in FIG. 5, although the voltage waveforms $V_1$ and $V_2$ of the drive voltages are set to be in antiphase (phase difference $\phi=180°$), the phase difference therebetween may be shifted to some extent from 180°. For example, in a case where a component (noise vibration) other than the intended resonance vibration occurs, there may be cases where the phase difference between $V_1$ and $V_2$ is shifted from 180° by a small amount in order to eliminate this component.

Figure 15:
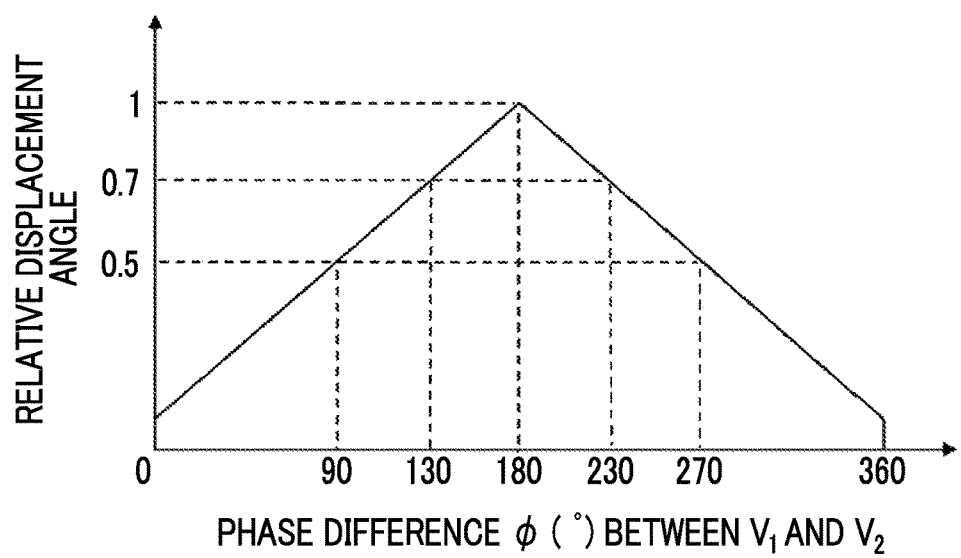
FIG. 15 is a graph showing the relationship between a phase difference of a voltage waveform and a relative displacement angle.

FIG. 15 shows the relationship between the phase difference between $V_1$ and $V_2$ and the relative displacement angle. The displacement angle is the maximum when the phase difference between $V_1$ and $V_2$ is 180° (in antiphase with each other) and is the minimum when the phase difference is 0° (in phase with each other). In order to obtain the sufficient displacement angle, typically, the phase difference is preferably within a range of $90° \leq \phi \leq 270°$. Moreover, the phase difference is more preferably within a range of $130° \leq \phi \leq 230°$.

Figure 16:
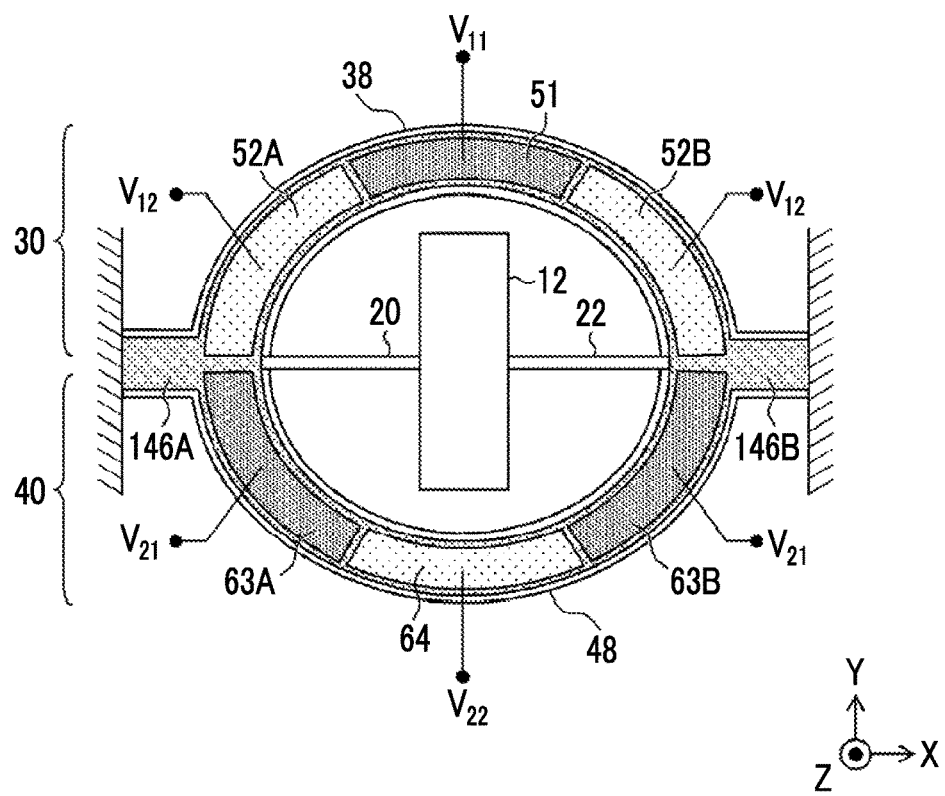
FIG. 16 is an explanatory view of a case where four types of voltage waveforms are used in the device structure of FIG. 8.

When the present invention is implemented, the types of the drive waveforms may be two or more types. For example, as illustrated in FIG. 16, the voltage waveform applied to the first electrode part 51 may be set to $V_{11}$, the voltage waveform applied to the second electrode parts 52A and 52B may be set to $V_{12}$, the voltage waveform applied to the third electrode parts 63A and 63B may be set to $V_{21}$, and the voltage waveform applied to the fourth electrode part 64 may be set to $V_{22}$.

As these four types of drive voltages, for example, the following waveforms may be used.

$$V_{11} = V_{off11} + V_{11A} \sin \omega t$$

$$V_{12} = V_{off12} + V_{12A} \sin(\omega t + \phi)$$

$$V_{21} = V_{off21} + V_{21A} \sin \omega t$$

$$V_{22} = V_{off22} + V_{22A} \sin(\omega t + \phi)$$

In the expressions, each of $V_{11A}$, $V_{12A}$, $V_{21A}$, and $V_{22A}$ is the voltage amplitude, $\omega$ is the angular frequency, t is the time, and $\phi$ is the phase difference. The phase difference $\phi$ is within a range of $90° \leq \phi \leq 270°$, and more preferably within a range of $130° \leq \phi \leq 230°$.

$V_{11A}$, $V_{12A}$, $V_{21A}$, and $V_{22A}$ may have an arbitrary value of 0 or more. All of $V_{11A}$, $V_{12A}$, $V_{21A}$, and $V_{22A}$ may be set to different values, or some or all thereof may also be set to the same value. In addition, in the above expressions, the phases of $V_{11}$ and $V_{21}$ are coincident with each other, and the phases of $V_{12}$ and $V_{22}$ are coincident with each other. However, these phases do not need to be completely coincident with each other, and a slight phase shift of about ±10° is acceptable.

Furthermore, the application voltage is not limited to a sine wave, and periodic waveforms such as a square wave and a triangular wave may also be applied thereto.

<Drive Voltage Supplying Means (Driving Control Part)>

Figure 17:
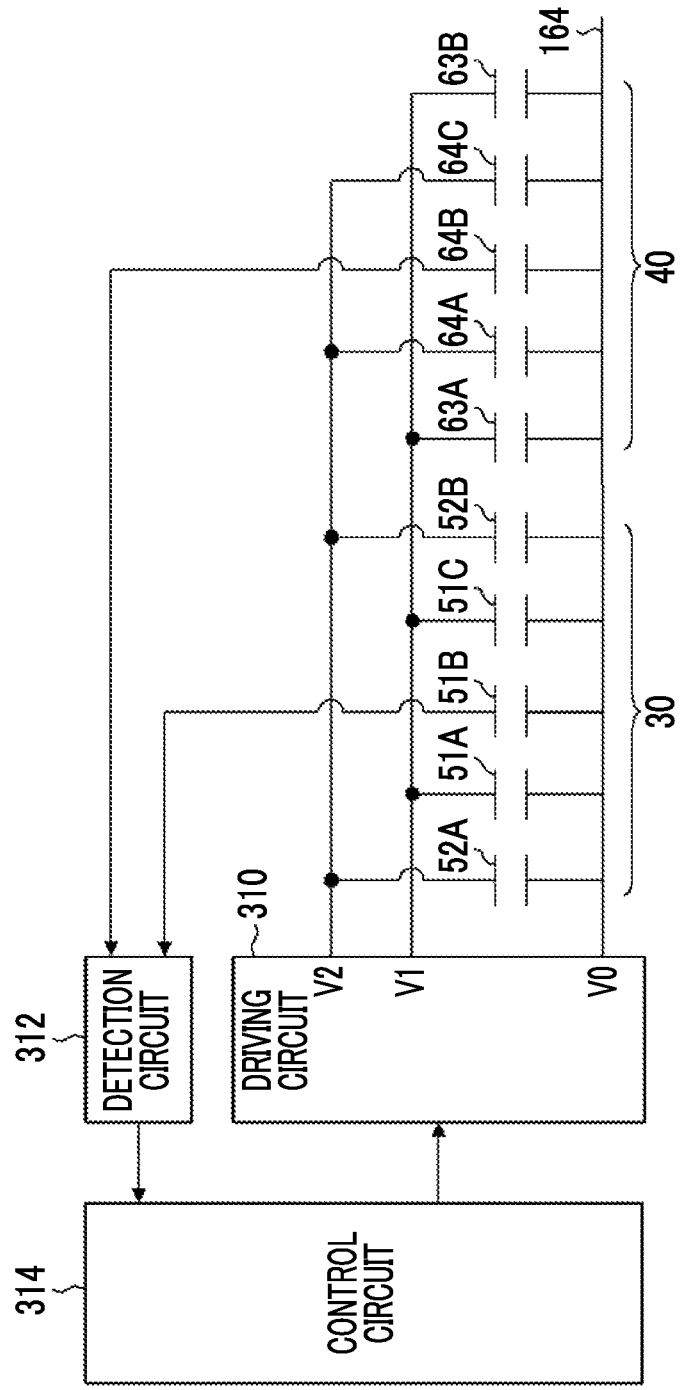
FIG. 17 is an explanatory view illustrating an example of a drive control system in the form of FIG. 10.

FIG. 17 is a diagram illustrating an example of the configuration of a control system used for driving a device. Here, the control system of the device form shown in FIG. 10 is illustrated. In the case of the device form described with reference to FIG. 10, as illustrated in FIG. 17, the electrodes 51A and 51C in the first electrode part 51 and the second electrode parts 52A and 52B in the first actuator part 30 used for driving, and the third electrode parts 63A and 63B and the electrodes 64A and 64C of and the fourth electrode part 64 in the second actuator part 40 are connected to the corresponding voltage output terminals of a driving circuit 310. The voltage waveform $V_1$ for driving is supplied from the driving circuit 310 to the electrodes 51A and 51C in the first electrode part 51 of the first actuator part 30 and the third electrode parts 63A and 63B of the second actuator part 40.

The voltage waveform $V_2$ for driving is supplied from the driving circuit 310 to the second electrode parts 52A and 52B of the first actuator part 30 and the electrodes 64A and 64C in the fourth electrode part 64 of the second actuator part 40. In addition, in FIG. 17, although the electrode parts to which the same drive voltage is applied are connected in parallel, a configuration in which drive voltages are individually supplied to the electrode parts may also be employed.

The driving circuit 310 supplies the voltage waveforms $V_1$ and $V_2$ of the drive voltage for causing the mirror part 12 to undergo resonance driving at near the resonance frequency fx of the resonance mode in which the mirror part 12 (see FIG. 3) performs rotational motion about the rotation axis $R_A$. During the resonance driving, the displacement amount reaches the highest value when the frequency of the drive voltage is caused to be completely coincident with the resonance frequency of the device. However, in this case, there are also disadvantage that it takes time to stabilize the vibration, the displacement amount greatly decreases when the resonance frequency slightly changes due to the influence of temperature and the like. In consideration of this, there may be cases where driving is performed at a frequency slightly shifted from the resonance frequency within a range where a necessary displacement amount can be secured. "Near the resonance frequency fx" has a meaning including a frequency coincident with the resonance frequency fx and a frequency slightly shifted from the resonance frequency fx within a range in which a necessary displacement amount can be secured.

Each of the electrode 51B of the first actuator part 30 and the electrode part 64B of the second actuator part 40, which are used for sensing, is connected to a detection circuit 312. The lower electrode 164 is connected to the common terminal ($V_O$ terminal, for example, ground terminal) of the driving circuit 310 or the detection circuit 312. Each electrode is connected to the driving circuit 310 or the detection circuit 312 via a wiring member such as wire bonding or a pattern wiring part on a substrate (not illustrated).

A voltage signal is detected from the electrode 51B and the electrode part 64B for sensing via the detection circuit 312, and the detection results are notified to a control circuit 314. On the basis of the signal obtained from the detection circuit 312, the control circuit 314 sends a control signal to the driving circuit 310 so as to maintain resonance and controls the application of the drive voltages to the first actuator part 30 and the second actuator part 40.

For example, feedback is applied to the driving circuit 310 so as to maintain resonance so that the phases of the waveform of the drive voltage applied to the piezoelectric actuator parts and the waveform detected from the stress detection part (sensor part) have predetermined values. The control circuit 314 controls the voltage or driving frequency applied to the piezoelectric actuator part based on the detection signal obtained from the stress detection part of the mirror part 12.

Such a feedback control circuit may be embedded in the detection circuit 312. In addition, the driving circuit 310, the detection circuit 312, and the control circuit 314 may be collectively configured as an integrated circuit such as an application specific integrated circuit (ASIC).

<Operational Effects of Embodiment>

According to the above-described embodiment, since the electrode parts are arranged according to the stress distribution generated in the piezoelectric bodies at the time of deformation of the actuator parts, the actuator parts can be efficiently driven, and compared to the configuration in the related art, a larger mirror tilt angle can be obtained.

Furthermore, according to the embodiment of the present invention, since the displacement efficiency is improved compared to the configuration in the related art, even in a case where some of the electrodes are used for stress detection, a sufficient displacement angle can be obtained.

<Another Example of Form of Piezoelectric Actuator Part>

Figure 18:
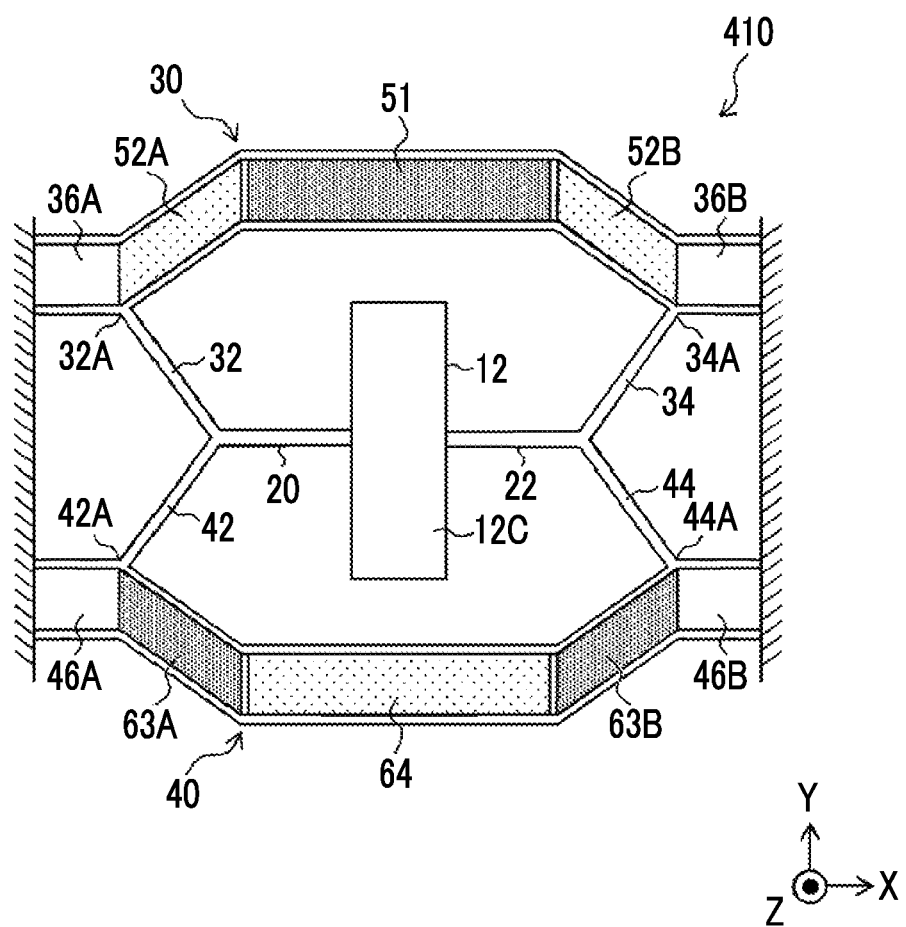
FIG. 18 is a plan view illustrating the configuration of main parts of a micromirror device according to a third embodiment.

FIG. 18 is a plan view illustrating the configuration of main parts of a micromirror device according to a third embodiment. In a micromirror device 410 illustrated in FIG. 18, like elements that are the same as or similar to those described with reference to FIG. 1 are denoted by like reference numerals, and description thereof will be omitted. In addition, in FIG. 18, illustration of the fixing frame 18 (see FIG. 1) is omitted. The micromirror device 410 corresponds to a form of "mirror driving device".

In the first actuator part 30 of the micromirror device 410 illustrated in FIG. 18, the movable part 38 that connects the first base end parts 36A and 36B, which are end parts on both sides in the x-axis direction, has a shape along three sides corresponding to the upper base and the two legs of a substantially isosceles trapezoid. Similarly, in the second actuator part 40 of the micromirror device 410, the movable part 48 that connects the second base end parts 46A and 46B, which are end parts on both sides in the x-axis direction, has a shape along three sides corresponding to the upper base and the two legs of a substantially isosceles trapezoid.

The first actuator part 30 and the second actuator part 40 having the actuator shape as illustrated in FIG. 18 may be employed.

As the actuator shapes of the first actuator part 30 and the second actuator part 40, various forms are possible. As illustrated in FIGS. 1, 3, and 18, various forms of a configuration in which the movable part 38 that extends from the one first base end part 36A of the base end parts on both sides in the x-axis direction in the first actuator part 30 to the other first base end part 36B has a shape bypassing the mirror part 12, and the movable part 48 that extends from the one second base end part 46A of the base end parts on both sides in the x-axis direction in the second actuator part 40 to the other second base end part 46B has a shape bypassing the mirror part 12 can be designed.

<Modification Example of Mirror Support Part>

In the above-described embodiment, the first torsion bar part 20 and the second torsion bar part 22 are connected to positions coincident with the rotation axis $R_A$ of the mirror part 12, and are formed to extend in the axial direction of the rotation axis $R_A$ toward the outside of the mirror part 12. In addition, FIG. 3 illustrates an example in which the first torsion bar part 20 and the second torsion bar part 22 are connected to the positions coincident with the rotation axis $R_A$ of the mirror part 12. However, the connection positions of the torsion bar parts may not be strictly coincident with the rotation axis $R_A$, and the torsion bar parts are not necessarily limited to a form of connection to a single point, and may be connected to a plurality of points.

For example, in a case where the substantially center portion in the longitudinal direction of the mirror part 12 (not limited to the true center point on design but the vicinity thereof) is the rotation axis $R_A$, in addition to an embodiment in which a torsion bar is connected to and is supported by a single point at the position substantially coincident with the rotation axis $R_A$, a structure in which torsion bars are connected at positions of two or more points in axial symmetry with respect to the position of the rotation axis $R_A$ interposed therebetween within a range in which the position can be regarded as the substantially center portion, is also possible.

<Application Example>

The mirror driving device of the present invention can be used in various applications as an optical device that reflects light such as laser light and changes the traveling direction of light. For example, the mirror driving device can be widely applied to an optical deflector, an optical scanning device, a laser printer, a barcode reader, a display device, various optical sensors (distance-measuring sensors and shape measurement sensors), an optical communication device, a laser projector, an optical coherence tomography diagnostic device, and the like. Furthermore, the present invention is not limited to the applications in which light is reflected, and can also be applied to a mirror device in applications in which sound waves are reflected.

In addition, the present invention is not limited to the above-described embodiments, and many modifications are possible by those with ordinary skill in the art within technical scope of the present invention.

EXPLANATION OF REFERENCES

10: micromirror device
12: mirror part
12C: reflecting surface
13: deformation prevention frame
14: mirror support part
15: mirror part
16: piezoelectric actuator part
18: fixing frame
20: first torsion bar part
22: second torsion bar part
30: first actuator part
32, 34: connection part
32A, 34A: connection portion
36A, 36B: first base end part
38: movable part
40: second actuator part
42, 44: connection part
42A, 44A: connection portion
46A, 46B: second base end part
48: movable part
51: first electrode part
52A, 52B: second electrode part
63A, 63B: third electrode part
64: fourth electrode part
110: micromirror device
132, 134: connection portion
142: connection point
144: connection point
160: vibration plate
164: lower electrode
166: piezoelectric body
168: upper electrode
310: driving circuit
312: detection circuit
314: control circuit
410: micromirror device

What is claimed is:

1. A mirror driving device comprising:

a mirror part having a reflecting surface;

a mirror support part which is connected to the mirror part and supports the mirror part so as to be rotatable about a rotation axis, the mirror part having a first side and a second side which are disposed opposite to each other across a center of the mirror part and along an axial direction of the rotation axis, the mirror support part including a first torsion bar part and a second torsion bar part which are parallel to the axial direction, separated from each other across the mirror part and along the axial direction, and connected respectively to the first side and the second side of the mirror part;

a piezoelectric actuator part which is connected to the mirror support part and generates a driving force to rotate the mirror part about the rotation axis; and a fixing part which supports the piezoelectric actuator part, wherein:

the piezoelectric actuator part includes a first actuator part and a second actuator part which are deformed by an inverse piezoelectric effect of a piezoelectric body caused by application of a drive voltage, the first actuator part and the second actuator part are disposed opposite to each other across the rotation axis and along an orthogonal direction which is orthogonal to both a film thickness direction of the piezoelectric body and the axial direction of the rotation axis, the first actuator part is connected to the first torsion bar part and the second torsion bar part respectively through a first connection member and a second connection member which are connected to the first actuator part respectively at a first connection point and a second connection point, the second actuator part is connected to the first torsion bar part and the second torsion bar part respectively through a third connection member and a fourth connection member which are connected to the second actuator part respectively at a third connection point and a fourth connection point, each of the first actuator part and the second actuator part is supported by the fixing part in a both-end supported beam structure, the first actuator part has a first base end part and a second base end part which are disposed opposite to each other along the axial direction and are fixed to the fixing part, the first base end part is further than the first connection point from the center of the mirror part, and the second base end part is further than the second connection point from the center of the mirror part, the first actuator part includes a first movable part that extends between the first base end part and the second base end part and has a shape bypassing the mirror part, the second actuator part has a third base end part and a fourth base end part which are disposed opposite to each other along the axial direction and are fixed to the fixing part, the third base end part is further than the third connection point from the center of the mirror part, and the fourth base end part is further than the fourth connection point from the center of the mirror part, the second actuator part includes a second movable part that extends between the third base end part and the fourth base end part and has a shape bypassing the mirror part, the first base end part and the third base end part are disposed separately from and opposite to each other along the orthogonal direction, and the second base end part and the fourth base end part are disposed separately from and opposite to each other along the orthogonal direction, the mirror support part is driven to be tilted by causing the first actuator part and the second actuator part to bend in opposite directions, upper electrodes of the first actuator part respectively include a first electrode part and a second electrode part constituted by a single or a plurality of electrodes, upper electrodes of the second actuator part respectively include a third electrode part and a fourth electrode part constituted by a single or a plurality of electrodes, an arrangement of the first electrode part, the second electrode part, the third electrode part, and the fourth electrode part corresponds to a stress distribution of principal stresses in an in-plane direction orthogonal to the film thickness direction of the piezoelectric body during resonance mode vibration accompanied with tilt displacement of the mirror part due to rotation about the rotation axis, and a piezoelectric portion corresponding to positions of the first electrode part and the third electrode part and a piezoelectric portion corresponding to positions of the second electrode part and the fourth electrode part are configured to generate stresses in opposite directions during the resonance mode vibration.

2. The mirror driving device according to claim 1, wherein:

each of the first electrode part, the second electrode part, the third electrode part and the fourth electrode part is used as an electrode for driving that applies a voltage for driving, at least one electrode of the first electrode part, the second electrode part, the third electrode part and the fourth electrode part is divided into a plurality of electrodes, and some of the plurality of electrodes are used as electrodes for detection that detect a voltage generated by a piezoelectric effect due to a deformation of the piezoelectric body.

3. The mirror driving device according to claim 1, wherein each of the first actuator part and the second actuator part is a piezoelectric unimorph actuator having a laminated structure in which a vibration plate, a lower electrode, a piezoelectric body, and an upper electrode are laminated in this order.

4. The mirror driving device according to claim 1, wherein the mirror part, the mirror support part, the first actuator part, and the second actuator part have a line symmetrical form with respect to the rotation axis as an axis of symmetry, in a plan view in a non-driven state.

5. The mirror driving device according to claim 1, wherein the mirror part, the mirror support part, the first actuator part, and the second actuator part have a line symmetrical form with respect to a center line which passes through the center of the mirror part and is orthogonal to the rotation axis as an axis of symmetry, in a plan view in a non-driven state.

6. The mirror driving device according to claim 1, further comprising a driving circuit which applies a voltage for driving to electrodes constituting at least one electrode part of the first electrode part or the third electrode part, and applies a voltage for driving to electrodes constituting at least one electrode part of the second electrode part or the fourth electrode part, wherein a phase difference $\phi$ between the drive voltage applied to at least one electrode part of the first electrode part or the third electrode part and the drive voltage applied to at least one electrode part of the second electrode part or the fourth electrode part is within the range of $130° \leq \phi \leq 230°$.

7. The mirror driving device according to claim 1, wherein:

some of the electrodes among a plurality of electrodes constituting the first electrode part, the second electrode part, the third electrode part, and the fourth electrode part are set to be at a floating potential, and a detection circuit which detects a voltage generated by a piezoelectric effect accompanied with deformation of the piezoelectric body from the electrode at the floating potential is provided.

8. The mirror driving device according to claim 1, further comprising a driving circuit which supplies a drive voltage to the piezoelectric actuator part and supplies a voltage waveform of the drive voltage for causing the mirror part to undergo resonance driving.

9. The mirror driving device according to claim 1, wherein the piezoelectric body used in the piezoelectric actuator part is a thin film having a thickness of 1 to 10 μm and is a thin film directly formed on a substrate which serves as a vibration plate.

10. The mirror driving device according to claim 1, wherein:

the piezoelectric body used in the piezoelectric actuator part is one or two or more perovskite type oxides represented by the following general formula (P-1), General formula $ABO_3$     (P-1)

in the formula, A is an element in A-site and is at least one element including Pb, B is an element in B-site and is at least one element selected from the group consisting of Ti, Zr, V, Nb, Ta, Sb, Cr, Mo, W, Mn, Sc, Co, Cu, In, Sn, Ga, Zn, Cd, Fe, Mg, Si, and Ni, O is an oxygen element, and the molar ratio among the A-site element, the B-site element, and the oxygen element is 1:1:3 as a standard, and the molar ratio may be deviated from the reference molar ratio within a range in which a perovskite structure is able to be achieved.

11. The mirror driving device according to claim 1, wherein:

the piezoelectric body used in the piezoelectric actuator part is one or two or more perovskite type oxides represented by the following general formula (P-2), General formula $A_a(Zr_x,Ti_y,M_{b-x-y})_bO_c$ (P-2)

in the formula, A is an element in A-site and is at least one element including Pb, M is at least one element selected from the group consisting of V, Nb, Ta, and Sb, $0<x<b$, $0<y<b$, and $0 \leq b-x-y$ are satisfied, and a:b:c=1:1:3 is standard, and the molar ratio may be deviated from the reference molar ratio within a range in which the perovskite structure is able to be achieved.

12. The mirror driving device according to claim 11, wherein:

the perovskite type oxide (P-2) includes Nb, and the molar ratio Nb/(Zr+Ti+Nb) is 0.06 or more and 0.20 or less.

13. A mirror driving method in the mirror driving device according to claim 1, wherein a drive voltage is applied to an electrode constituting at least one electrode part of the first electrode part or the third electrode part, a drive voltage is applied to an electrode constituting at least one electrode part of the second electrode part or the fourth electrode part, and a phase difference φ between the drive voltage applied to at least one electrode part of the first electrode part or the third electrode part and the drive voltage applied to at least one electrode part of the second electrode part or the fourth electrode part is within the range of $130° \leq \phi \leq 230°$.

14. The mirror driving method according to claim 13, wherein:

some of the electrodes among a plurality of electrodes constituting the first electrode part, the second electrode part, the third electrode part, and the fourth electrode part are used as a detection electrode which detects a voltage generated by a piezoelectric effect accompanied with deformation of the piezoelectric body, and a detection signal is obtained from the detection electrodes during driving of the mirror part.

* * * * *